United States Patent [19]
Noddin

[11] Patent Number: 5,868,950
[45] Date of Patent: Feb. 9, 1999

[54] METHOD TO CORRECT ASTIGMATISM OF FOURTH YAG TO ENABLE FORMATION OF SUB 25 MICRON MICRO-VIAS USING MASKING TECHNIQUES

[75] Inventor: David B. Noddin, Eau Claire, Wis.

[73] Assignee: W. L. Gore & Associates, Inc., Newark, Del.

[21] Appl. No.: 748,111

[22] Filed: Nov. 8, 1996

[51] Int. Cl.$^6$ ........................................................ B44C 1/22
[52] U.S. Cl. ................................ 216/18; 216/20; 216/65; 428/209
[58] Field of Search .................................. 216/13, 17, 18, 216/20, 33, 39, 41, 56, 65; 29/852; 219/121.68, 121.69; 174/250, 266; 427/97; 361/748; 428/209, 901

[56] References Cited

U.S. PATENT DOCUMENTS

| | | | |
|---|---|---|---|
| 3,953,566 | 4/1976 | Gore | 264/288 |
| 4,348,253 | 9/1982 | Subbarao et al. | |
| 4,445,978 | 5/1984 | Whartenby et al. | |
| 4,473,737 | 9/1984 | Anthony . | |
| 4,482,516 | 11/1984 | Bowman et al. | 264/128 |
| 4,547,836 | 10/1985 | Anthony . | |
| 4,595,428 | 6/1986 | Anthony et al. | |
| 4,622,058 | 11/1986 | Leary-Renick et al. | 216/65 X |
| 4,647,476 | 3/1987 | Anthony . | |
| 4,705,762 | 11/1987 | Ota et al. | 501/87 |
| 4,720,308 | 1/1988 | Anthony et al. | |
| 4,780,177 | 10/1988 | Wojnarowski et al. | 216/65 X |
| 4,901,136 | 2/1990 | Neugebauer et al. | |
| 4,913,656 | 4/1990 | Gordon et al. | |
| 4,940,508 | 7/1990 | Shamouilian et al. | 156/345 X |
| 4,943,032 | 7/1990 | Zdeblick . | |
| 4,943,346 | 7/1990 | Mattelin | 216/65 X |
| 4,959,119 | 9/1990 | Lantzer . | |
| 4,985,296 | 1/1991 | Mortimer, Jr. | 428/220 |

(List continued on next page.)

FOREIGN PATENT DOCUMENTS

WO 90/01374  2/1990  WIPO .

OTHER PUBLICATIONS

Article, Lizotte et al., "Laser drilling speeds BGA packaging", Solid State Technology, Sep. 1996, pp. 120–128.
Article, Eskew, et al., "A Laser drill and patterning system for low cost, rapid prototyping", ICEMCM '95, pp. 314–319.
Brochure, "IMPACT — Laser Processing Systems", Lumonics Corporation, 4 pages.
Article, Tourne, "Laser Via Technologies for High Density MCM–L Fabrication", ICEMCM '95, pp. 71–76.
Article, Carey, "MCM–L Substrates for a 300 MHZ Workstation", ICEMCM '95, pp. 537–542.
Article, Patel et al., "Projection Laser Ablation Mask Alternatives", ICEMCM '95, pp. 320–326.
Technical Paper, Kosto et al., "Low Cost Through–Hole Activation Method for PTFE Based Substrates", IPC, pp. P6–5–1 through P6–5–8.
Article, Jain et al., "Large–Area, High Throughput, High–Resolution Patternmaking and Via–Drilling System", ICEMCM '95, pp. 327–335.
Article, Lemke, "Recent Developments in the Production and Application of Advanced Laminate Based MCMs and Chip Carriers", ICEMCM '95, pp. 235–240.
Article, Freda et al. "Laminate Based Substrates in Semiconductor Packages", ICEMCM '95, pp. 559–566.

*Primary Examiner*—William Powell
*Attorney, Agent, or Firm*—Victor M. Genco, Jr.

[57] ABSTRACT

A method of forming a via in a laminated substrate by placing a first mask between an output optics of a laser and an exposed surface of a laminated substrate. The first mask has a first aperture corresponding to a location of a via in the substrate. A second mask is placed between the first mask and the output optics of the laser. The second mask has a second aperture disposed within a main beam of a laser beam output from the laser and blocks side lobes of the laser beam from reaching the exposed surface of the substrate.

62 Claims, 13 Drawing Sheets

U.S. PATENT DOCUMENTS

| | | |
|---|---|---|
| 5,009,607 | 4/1991 | Gordon et al. . |
| 5,019,997 | 5/1991 | Haller . |
| 5,071,359 | 12/1991 | Arnio et al. . |
| 5,108,785 | 4/1992 | Lincoln et al. . |
| 5,171,964 | 12/1992 | Booke et al. . |
| 5,224,265 | 7/1993 | Dux et al. . |
| 5,245,751 | 9/1993 | Locke et al. . |
| 5,251,097 | 10/1993 | Simmons et al. . |
| 5,293,025 | 3/1994 | Wang . |
| 5,293,626 | 3/1994 | Priest et al. . |
| 5,331,203 | 7/1994 | Wojnarowski et al. . |
| 5,355,397 | 10/1994 | Hanson et al. . |
| 5,377,404 | 1/1995 | Berg . |
| 5,378,313 | 1/1995 | Pace . |
| 5,378,318 | 1/1995 | Weling et al. . |
| 5,391,516 | 2/1995 | Wojnarowski et al. . |
| 5,428,803 | 6/1995 | Chen et al. . |
| 5,442,475 | 8/1995 | Bausman et al. . |
| 5,459,634 | 10/1995 | Nelson et al. . |
| 5,466,892 | 11/1995 | Howard et al. . |
| 5,509,553 | 4/1996 | Hunter, Jr. et al. . |
| 5,541,367 | 7/1996 | Swamy . |
| 5,541,731 | 7/1996 | Freedenberg et al. . |
| 5,593,606 | 1/1997 | Owen et al. ........................ 219/121.71 |

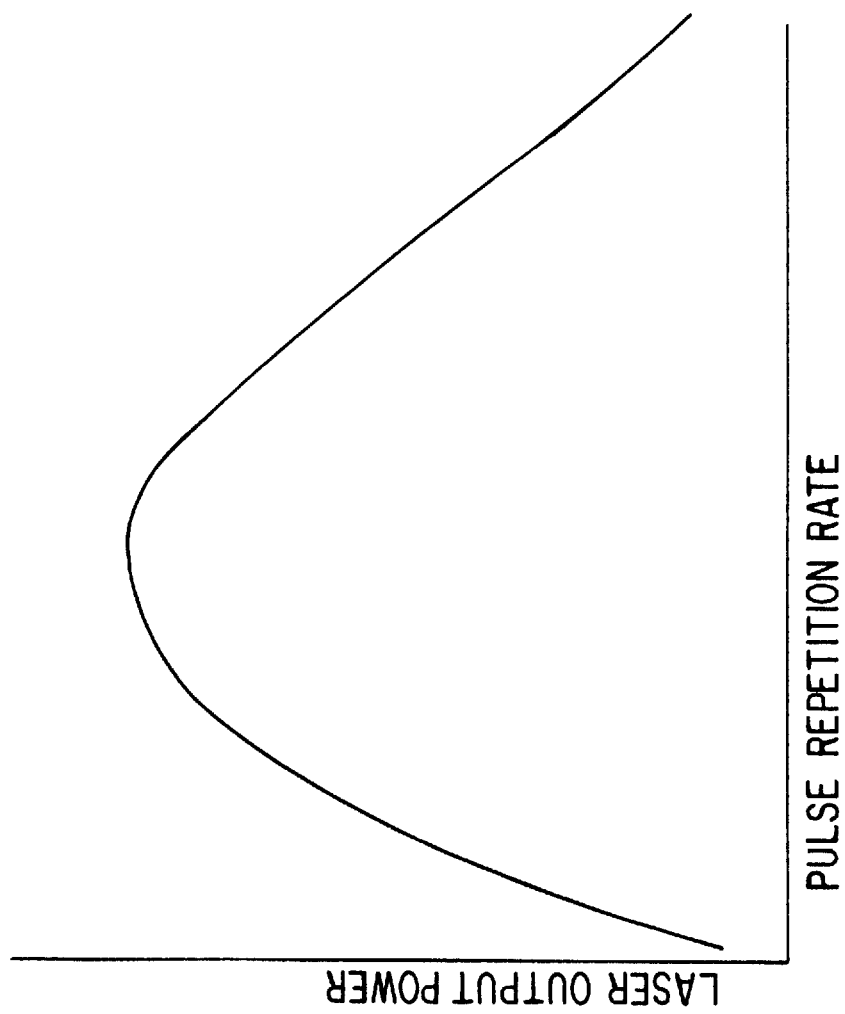

METHOD TO CORRECT ASTIGMATISM OF FOURTH YAG TO ENABLE FORMATION OF SUB 25 MICRON MICRO-VIAS USING MASKING TECHNIQUES

FIELD OF THE INVENTION

The present invention relates to the field of integrated circuit packaging, methods of manufacturing integrated circuit packaging interconnections, and more particularly, to methods and apparatuses for forming vias in a multilayered substrate having alternating dielectric and conductive layers. The invention further relates to methods for making via interconnections.

BACKGROUND OF THE INVENTION

Interconnection and packaging related issues are among the main factors that determine not only the number of circuits that can be integrated on a chip, but also the performance of the chip. These issues have gained in importance as advances in chip design have led to reduced feature sizes of transistors and enlarged chip dimensions. Industry has come to realize that merely having a fast chip will not result in a fast system; it must also be supported by an equally fast and reliable packaging.

Essentially, packaging supplies the chip with signals and power, and performs other functions such as heat removal, physical support and protection from the environment. Another important function is simply to redistribute the tightly packed I/Os off the chip to the I/Os of a printed wiring board.

An example of a package-chip system is the "flip-chip" integrated circuit mounted on an area array organic package. Flip-chip mounting entails placing solder bumps on a die or chip, flipping the chip over, aligning the chip with the contact pads on a substrate, and re-flowing the solder balls in a furnace to establish bonding between the chip and the substrate. This method is advantageous in certain applications because the contact pads are distributed over the entire chip surface rather than being confined to the periphery as in wire bonding and most tape-automated bonding (TAB) techniques. As a result, the maximum number of I/O and power/ground terminals available can be increased, and signal and power/ground interconnections can be more efficiently routed on the chips.

With flip-chip packaging, thermal expansions due to mismatches between the semiconductor chip and the substrate can cause strains at the bumps, and thus, could lead to failure. Regardless of which packaging technique is employed, material issues such as the aforementioned thermally induced strain causes a chip package designer to select and match materials with great care.

In the manufacture of integrated circuit packaging, the chip package designer attempts to obtain ever greater wiring densities while at the same time forming interconnections between adjacent layers that provide reliable circuits with as little inductance and resistance as possible. Thus, the formation of high quality via holes, or vias, that are used for interconnections, is an important aspect of forming high quality interconnections.

It has been known to use lasers to form vias in multilayered ceramic packages or substrates. For example, U.S. Pat. No. 5,378,313 to Pace discloses a process for manufacturing a multilayer hybrid for a ceramic multichip module (MCM-C) device that uses a metallic conductive pattern layer formed on an inorganic insulating layer. Vias having a diameter of between 25–125 $\mu$m are formed by laser drilling through an inorganic insulating layer for making electrical connections between conductive pattern layers. According to Pace, the overall thickness of the inorganic insulating layers should be less than 50 $\mu$m, preferably less than 40 $\mu$m, and more preferably less than 30 $\mu$m.

It has been known to form blind-vias using lasers operating predominately in a scanning mode using excimer gas lasers in the 193 nanometer (nm), 248 nm, and 308 nm ranges. The beam is scanned over a metal mask and then focused to a spot through apertures formed in the mask. However, the mask tends to absorb the laser energy, thus generating heat distortion, forming oxides and/or redepositing ablated material onto the surface of the mask.

The current trend in integrated circuit packaging technology is shifting from the ceramic substrate-based interconnection circuit devices to organic substrate-based interconnection circuit devices for single chip modules (SCMs) and multi-chip modules (MCMs) because the organic substrate-based devices are less expensive to process and fabricate. However, the lasers known for via formation in the past are not generally suitable for use with organic-based multilayer packages.

The MCM-C devices are typically formed by multilayer conductive patterns that are combined together in a co-fired monolithic structure. Each layer of an MCM-C device is formed from a green ceramic tape having a conductive pattern printed on the green tape. Vias for interconnecting the different layers are punched, or laser drilled, through a green tape layer. The individual green tape layers are then laminated together and co-fired to form the monolithic structure. MCM-C devices suffer from lamination size variations caused by shrinkage when fired.

When relatively thinner conventional organic substrate-based interconnection circuit devices are attached to an integrated circuit die, the thinner structures of the devices flex and bend more readily than the thicker ceramic substrate devices because of differences in the coefficients of thermal expansion (CTE) between the materials used in the organic substrate devices and the integrated circuit die or chip, and because of mechanical stresses that occur when the interconnection devices and the chips are attached. Relatively thicker conventional organic-substrate-based interconnection devices do not experience the same degree of flexure as the relatively thinner conventional devices primarily because of the differences in relative stiffnesses. That is, the flexural or bending modulus of an interconnection device increases proportionally to the thickness the device cubed. So, an interconnection device that is twice as thick as another interconnection device made of the same substrate has a flexural modulus that is eight times greater.

A need exists for an integrated circuit package, and methods of making such a package, made of organic-based-substrate materials that have small via diameters and high via aspect ratios, and that provide high conductor routing density. Additionally, there is a need for an interconnection device formed from an organic dielectric substrate material that has a coefficient of thermal expansion (CTE) that matches the CTE of a printed circuit board and the CTE of an integrated circuit chip to which the interconnection device is bonded so that the bending effects caused by CTE mismatch are minimized.

SUMMARY OF THE INVENTION

The present invention provides an interconnection circuit device having vias and a method for making vias in an interconnection circuit device. The vias formed by the present invention have smaller entrance diameters, exit diameters, greater aspect ratios and lower average via resistances than vias formed by conventional techniques. Additionally, the present invention provides an improved high-volume manufacturing yield over conventional approaches because a high degree of manufacturing repeatability is ensured by the present invention. For example, vias produced according to the present invention have low entrance and exit diameter variances, low average via resistances, and correspondingly low via resistance variances.

The present invention provides a method for laser drilling blind-vias in a laminated substrate, where the blind-vias have via entrances of 75 $\mu$m or less and aspect ratios of 1:1 and greater. According to the invention, the laminated substrate has a first conductive layer, a dielectric layer formed on the first conductive layer, and an outer second conductive layer formed on the dielectric layer. The second conductive layer includes a preformed aperture at each location where a blind-via is to be formed. The dielectric layer is laser drilled through to the first conductive layer using a plurality of laser pulses that are applied through the preformed apertures in the outer second conductive layer. Each laser pulse applied to the dielectric layer has an energy density per pulse that is greater than an ablation threshold of the dielectric layer, but is less than an ablation threshold of the first conductive layer.

When the laser emits at a wavelength of 355 nm, the energy per pulse applied to the dielectric material is between 0.5 J/cm$^2$ and 11 J/cm$^2$, inclusive, for a pulse width that is 100 nanoseconds (ns) or less. When the dielectric layer is made of an ePTFE matrix containing a mixed cyanate ester-epoxy adhesive, the energy density per pulse applied to the dielectric layer is preferably between 0.5 J/cm$^2$ and 11 J/cm$^2$, inclusive. When the ePTFE-based dielectric layer includes a filler-adhesive mixture, the energy density per pulse applied to the dielectric layer is preferably nominally 7 J/cm$^2$. When the laser emits at a wavelength of 266 nm, the energy density per pulse applied to the dielectric material is between 0.2 J/cm$^2$ and 3 J/cm$^2$, inclusive, and preferably is nominally 2 J/cm$^2$ for a pulse width of 100 ns or less.

Once the blind-via has been drilled through the dielectric layer to the first conductive layer, a blind-via post-pulse processing technique is used for enhancing the properties of the via. The output conditions of the laser are changed, preferably in situ over the drilled blind-via, and the first conductive layer is then laser drilled at the changed output conditions for a predetermined number of pulses, preferably between 1 to 10, inclusive. Each pulse applied to the first conductive layer has an energy density per pulse that is greater than an ablation threshold of the first conductive layer. The predetermined number of pulses at the second energy density per pulse level is chosen so that any dielectric material remaining on the surface of the first conductive layer is ablated and so that the surface of the first conductive layer becomes molten.

When the laser emits at a wavelength of 355 nm, the energy density per pulse applied to the first conductive layer is greater than 5 J/cm$^2$, and preferably is nominally 11 J/cm$^2$ for a pulse width of 100 ns or less. When the laser emits at a wavelength of 266 nm, the energy density per pulse applied to the conductive layer is greater than 1.5 J/cm$^2$, and preferably is nominally 5 J/cm$^2$ for a pulse width of 100 ns or less.

After the blind-via is filled with a conductive material, an average resistance of an electrical connection through the blind-via to the first conductive layer is about 2 m$\Omega$. A variance of the resistance of the electrical connection through the blind-via to the first conductive layer is about 0.25 m$\Omega^2$.

The present invention also provides a method for laser drilling through-vias in a laminated substrate where the through-vias have via entrances of 75 $\mu$m or less, and aspect ratios of between 3:1 and 25:1. The laminated substrate is laser drilled from a top surface of the substrate to an exposed bottom surface of the substrate using a plurality of laser pulses that are preferably trepanned in a circle, but other trepanning patterns, such as ovals and squares, can be used. Each pulse has an energy density per pulse that is sufficient for ablating both dielectric layers and conductive layers forming the laminated substrate.

When the laser emits at a wavelength of 355 nm, the energy density per pulse applied to the substrate for drilling a through-via is greater than 2 J/cm$^2$, and preferably is nominally 10 J/cm$^2$ for a pulse width of 100 ns or less. When the laser emits at a wavelength of 266 nm, the energy density per pulse applied to the substrate for drilling a through-via is greater than 2 J/cm$^2$, and preferably is nominally 10 J/cm$^2$ for a pulse width of 100 ns or less.

The present invention also provides a method for enhancing the quality of a via entrance, whether the via is a blind-via or a through-via, by applying a polymeric photo-absorptive layer on an exposed top surface of the laminated substrate. The photo-absorptive layer is formed to be between 5 $\mu$m and 50 $\mu$m thick, inclusive, and is preferably about 25 $\mu$m thick. Ablated materials formed by laser drilling the substrate are redeposited on photo-absorptive layer surrounding the via. The photo-absorptive layer and the ablated material redeposited on the photo-absorptive layer are then removed.

The exit variance of a through-via can also be enhanced by applying a polymeric photo-absorptive layer on the exposed bottom surface of the laminated substrate that is between 5 $\mu$m and 50 $\mu$m thick, inclusive, and is preferably 25 $\mu$m thick. A layer of conductive material is then placed in intimate contact with the photo-absorptive layer formed on the bottom of the substrate. The through-via is drilled and the photo-absorptive layer formed on the bottom surface of the substrate and the layer of copper are removed. By providing the photo-absorptive layer and copper layer on the bottom surface of the laminated substrate, a variance of the exit width of the through-via of about 20 $\mu$m$^2$ is achieved when the aspect ratio of the through-via is about 10:1.

Once the through-via has been drilled through the substrate, the exit width variance can be further enhanced by performing one of several through-via post-pulse processing techniques of the invention. In one example of a through-via post-pulse processing technique, the output conditions of the laser are changed, preferably in situ over the drilled through-via, and the via is drilled a second time using a plurality of laser pulses having the energy density per pulse initially used for drilling the via. The laser pulses are then trepanned in a second predetermined pattern. Preferably, the second predetermined trepanning pattern is a circle having a diameter that is less than that of the diameter of the first circular trepanning pattern.

In a second example of a through-via post-pulse processing technique, the output conditions of the laser are changed, preferably in situ over the drilled though-via, and the via is drilled a second time using a plurality of laser pulses having a greater energy density per pulse than used for the initial drilling and that are trepanned in a second predetermined pattern at a trepanning rate that is less than that used for the initial drilling. Preferably, the trepanning rate, or spacing between pulses, for the initial drilling is between 0.5 $\mu$m and 6 $\mu$m, inclusive, while the second trepanning rate is 3 $\mu$m, or less, between pulses.

By performing either through-via post-pulse processing of the invention, high-aspect vias having exit widths of 75 $\mu$m, or less, are repeatably produced. For example, both through-via post-pulse processing techniques provide a variance of the exit width of the through-via of about 10 $\mu m^2$ when the aspect ratio of the through-via is 10:1. When the aspect ratio of the through-via is 20:1, a variance of the exit width of the through-via of about 15 $\mu m^2$ is achieved.

Since the entrance widths of the vias that are produced using the present invention are 75 $\mu$m, or less, and can have high aspect ratios, the present invention provides that an ultrasonic treatment in de-ionized water is applied to a drilled substrate for between 5 and 20 minutes, inclusive, thereby removing material redeposited on sidewalls of the via.

The quality of the vias produced by the present invention are further ensured by forming controlled thicknesses of copper oxide layers on the conductive copper layers so that dielectric layers better adhere to the copper layers. The conductive layers are commercially available with pre-formed oxide layers, or the oxide layers can be formed by immersing the conductive layer in a brown oxide bath solution or a red oxide bath solution, commercially available from McGean Rohco, at a temperature of between 120° F. to 150° F. for between 30 seconds to 5 minutes, to form a copper oxide layer. When a via is drilled, the amount of energy used is controlled so that thermal damage to the copper oxide layers and dielectric interface is minimal. After drilling, ablated substrate material is removed by cleaning the substrate using minimal exposures to acidic cleaners so that the copper oxide layers and concomitant dielectric layer adhesion is not compromised.

The blind-via and through-via drilling and post-pulse processing according to the present invention can be performed a plurality of times for drilling a number of vias in a laminated substrate.

The present invention also efficiently forms a plurality of blind-vias in a laminated substrate by providing a method that laser drills blind-vias in a laminated substrate preferably using a TEA $CO_2$ laser, and scanning the laser focal spot of the TEA laser for initially drilling the blind-vias. Afterward, each blind-via is laser drilled preferably using a YAG laser and either a drill pulse or a trepanning motion of a laser focal spot of the YAG laser that is within an entrance width of the blind-via. According to the invention, the YAG laser is selected from the group consisting of a frequency-tripled neodymium YAG (Nd:YAG) laser and a frequency-quadrupled Nd:YAG laser.

When a via is drilled with a laser having a wavelength of 266 nm, and the via has an entrance width of 25 $\mu$m and a masking copper layer is employed having a thickness of less than 10 $\mu$m, the present invention provides that a mask having an aperture is placed in the output beam of the laser at a distance from the output of the laser that is equal to or less than the Rayleigh range of the laser beam. The size of the aperture is selected so that side lobes of the laser beam are blocked from reaching the exposed surface of the substrate.

A fiducial registration scheme is provided by the present invention so that the individual conductive layers of a laminated substrate are formed without tolerance build-up problems. A registration mark is formed on the core layer of the substrate. The registration mark is then used as a fiducial registration point for forming a first layer on the core layer. The first layer is then laser drilled for exposing the registration mark on the core layer. Afterward, a second layer is formed on the first layer using the registration mark as a fiducial point. Additional layers of the laminated substrate are formed by repeating these processes.

The present invention also provides fiducial registration verification of conductive layers of a laminated substrate, preferably using kelvin resistors. Predetermined areas of resistive material are formed as part of a conductive layer and at a same corresponding location in each respective conductive layer. First and second voltage taps are respectively formed at first and second ends of each predetermined area. The first and second voltage taps are separated by a first predetermined design distance that is preferably selected so that a predetermined current injected into the resistive material has a uniform current density in the resistive material at the first and second voltage taps. A through-via is formed in the laminated substrate through the respective predetermined areas of resistive material and is connected to each predetermined area of resistive material between the first and second ends of each respective predetermined area. A total resistance is determined between the first end and the second end of each predetermined area of resistive material. A fractional resistance is determined between the first end of each predetermined area of resistive material and the through-via. A fiducial misregistration of each conductive layer is determined with respect to a location of the through-via based on the respective fractional resistance and the total resistance for each respective predetermined area of resistive material. That is, the misregistration of each conductive layer is based on a ratio of the fractional resistance of the conductive layer to the total resistance of the conductive layer.

The predetermined current is passed from the first end to the second end of each predetermined area of resistive material and a voltage is measured between each respective first and second voltage tap. Each respective total resistance is determined based on the predetermined current and the voltage measured between each respective first and second voltage taps. A voltage is measured between each respective first voltage tap and the through-via, and the fractional resistance is determined based on the predetermined current and the voltage measured between each respective first voltage tap and the through-via.

The misregistration $\delta$ for each conductive layer is determined with respect to the location of the through-via by $$\delta = \left( \frac{R_1 - R_2}{R_T} \right) 1_T$$

where $R_1$ is the fractional resistance of the predetermined area of resistive material between the first voltage tap and the through-via for a conductive layer; $R_2$ is the fractional resistance of the predetermined area of resistive material between the through-via and the second voltage tap; $R_T$ is the total resistance of the predetermined area of resistive material of the conductive layer between the first and second voltage taps, that is $R_1+R_2$; and $1_T$ is the first predetermined design distance separating the first and second voltage taps of the conductive layer.

The present invention provides a method for producing a low inductance via in a laminated substrate. A first dielectric layer is formed on a first conductive layer, and a second conductive layer is formed on the first dielectric layer. A first conductive path is formed in the first conductive layer that extends along a first route between a first node and a second node. A first blind-via is formed in the first dielectric layer at the second node and is connected to the first conductive path. A second conductive path is formed in the second conductive layer connected to the first blind-via. The second conductive path extends between a third node and the first blind-via along a second route that corresponds identically to at least a portion of the first route. A mutual inductance formed by the first conductive path with the second conductive path cancels a mutual inductance formed by the second conductive path with the first conductive path.

The low inductance via can be expanded by forming a second dielectric layer on the second conductive layer, a third conductive layer on the second dielectric layer, a third dielectric layer on the third conductive layer, and a fourth conductive layer on the third dielectric layer. A first buried-via is formed in the second dielectric layer at a third node and is connected to the second conductive path. A third conductive path is formed in the third conductive layer that is connected to the first buried via. The third conductive path extends between a fourth node and the first buried via along a third route that corresponds identically to at least a portion of the second route. A second blind-via is formed in the third dielectric layer at the fourth node and is connected to the third conductive path. A fourth conductive path is formed in the fourth conductive layer and is connected to the second blind-via. The fourth conductive path extends between a fifth node and the second blind-via along a fourth route that corresponds identically to at least a portion of the third route. A mutual inductance formed by the second conductive path with the third conductive path cancels a mutual inductance formed by the third conductive path with the second conductive path. Similarly, a mutual inductance formed by the third conductive path with the fourth conductive path cancels a mutual inductance formed by the fourth conductive path with the third conductive path.

A plurality of low inductance vias can be formed by arranging the blind-vias and buried-vias of the low inductance conductive vias into rows and columns that are parallel to axes of a Cartesian coordinate system. The respective routes of the conductive paths are parallel with each other and form an angle with the axes of the Cartesian coordinate system. Preferably, the respective routes form a 45° angle with the axes of the Cartesian coordinate system.

BRIEF DESCRIPTION OF THE DRAWINGS

The present invention is illustrated by way of example and not limitation in the accompanying figures in which like reference numerals indicate similar elements and in which:

FIG. 4 is a graph showing laser output power as a function of pulse repetition rate;

DETAILED DESCRIPTION OF THE INVENTION

Figure 1:
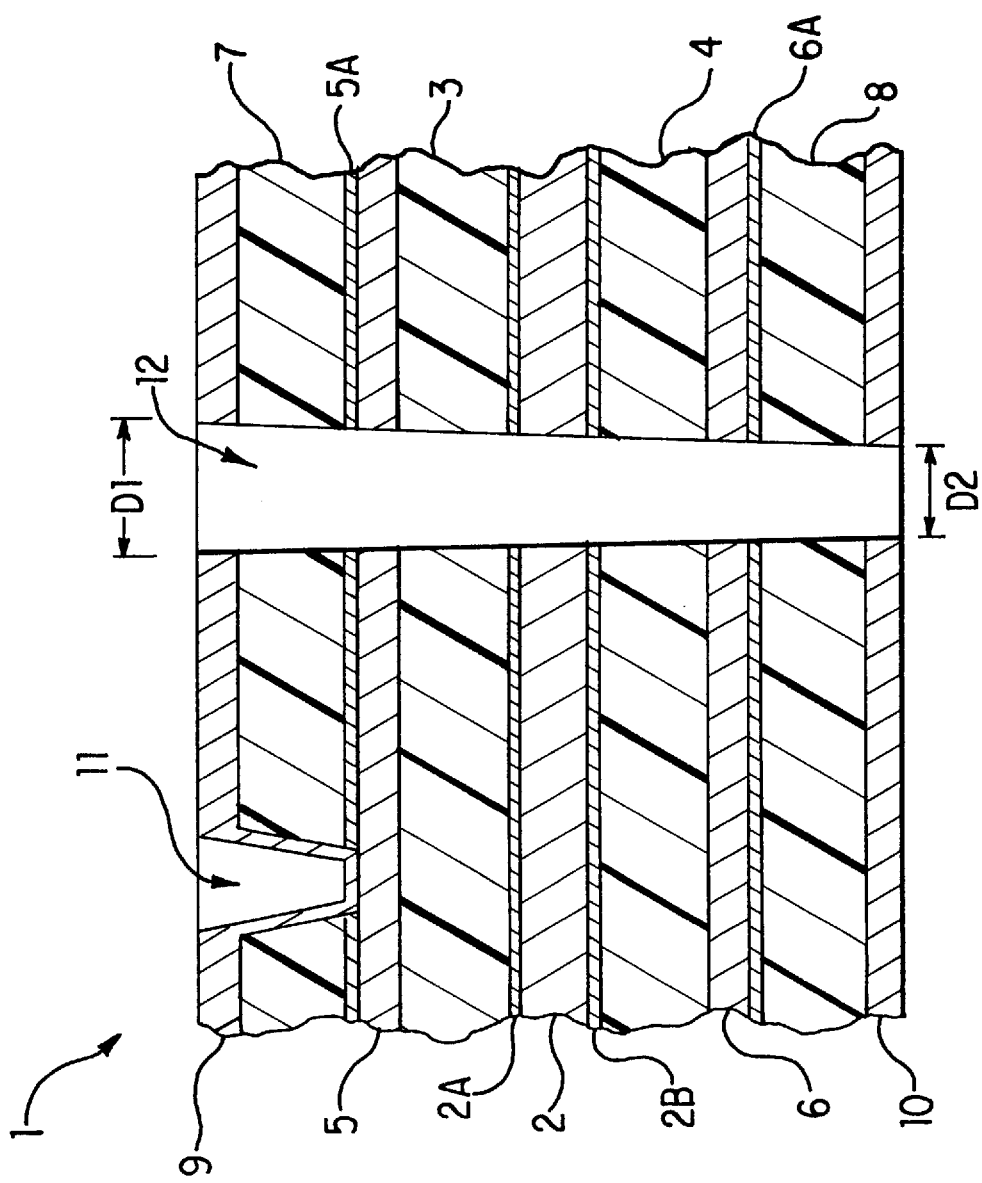
FIG. 1 is a cross-sectional view of a laminated substrate having a blind-via and a through-via formed by a method of the present invention.

Referring to FIG. 1, a laminated substrate 1 is constructed by serially, or sequentially, by laminating alternating layers of conductive and dielectric layers together. The various layers are positioned in a stack and then pressed together, usually with a dielectric material in a b-stage of curing so that the layers are not fully cured until after pressing.

Laminated substrate I may include any number of layers, although FIG. 1 illustrates a seven layer structure. Dielectric layers 3 and 4 are disposed on opposite sides of the core layer 2, and conductive layers 5 and 6 are disposed on the dielectric layers 3 and 4, respectively. A dielectric layer 7 is provided on the conductive layer 5, and a dielectric layer 8 is provided on the conductive layer 6. A conductive layer 9 is provided on the dielectric layer 7 and a conductive layer 10 is provided on the dielectric layer 8.

The layers are applied serially such that at first the core layer 2, dielectric layers 3 and 4 and conductive layers 5 and 6 are pressed and bonded together. The conductive layers are patterned, and any necessary blind-vias to connect conductive layers 3 and 4 are formed before the remaining layers are bonded to the structure. Subsequently, the additional dielectric layers 7 and 8 and conductive layers 9 and 10 are bonded to the other layers as shown in FIG. 1.

Alternatively, several metal/dielectric/metal layers can be simultaneously pressed together, rather than being done in series. This type of assembly could obviate the need for a core layer, such as core layer 2 in FIG. 1. Whether done serially or simultaneously, larger or smaller numbers of layers can be employed. Seven and nine layer substrates have many practical applications, as does the illustrated five conductive layer substrate.

A blind-via 11 extends through dielectric layer 7 and a through-via 12 extends through the entire laminated substrate 1. The laser drilling techniques employed to form vias 11 and 12 will be described more fully below. Vias 11 and 12 have entrance diameters of between 10 $\mu$m and 75 $\mu$m, inclusive. Further, through-vias formed using the methodology of the present invention are reliably and repeatably formed to have an aspect ratio, that is, the ratio of via depth to via diameter $D_1$, of between 3:1 to 25:1, inclusive.

Figure 2:
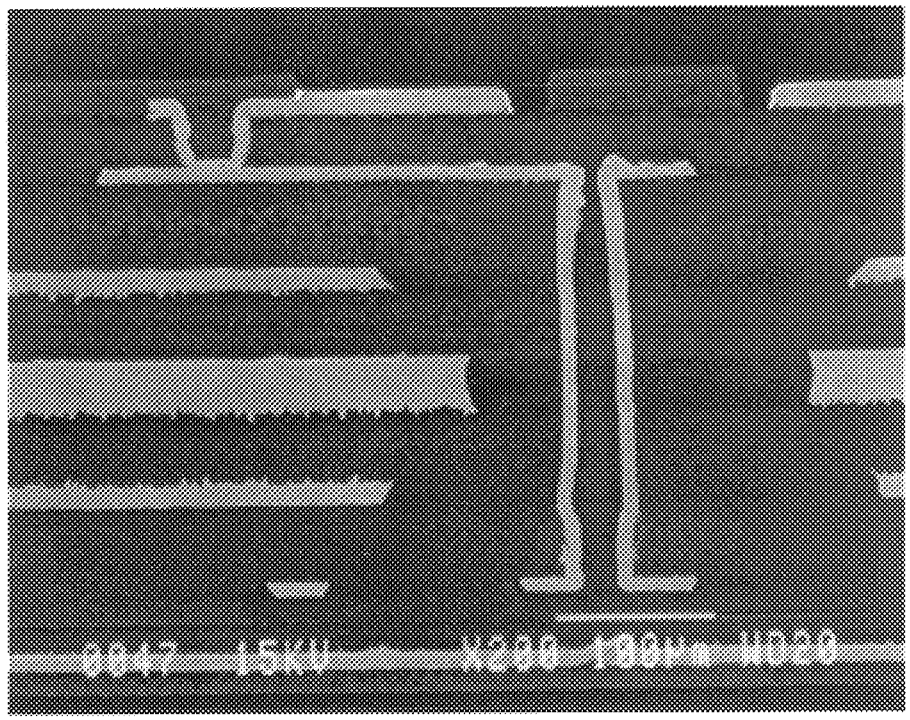
FIG. 2 is a photomicrograph showing a blind-via and a through-via formed by a method and an apparatus of the present invention.

FIG. 2 is a photomicrograph of a blind-via and a through-via that were formed by the method of the present invention. The blind-via has an entrance diameter of 50 $\mu$m and an aspect ratio of 1:1, and the through-via has an entrance diameter of 50 μm and an aspect ratio of 6:1. These are representative of the via sizes and aspect ratios achievable using the methodology and apparatuses described herein.

Core layer 2 is made of a conductive material, such as a 1 oz. copper layer having a nominal thickness of 38 μm. Other well-known conductive core materials can also be used such as aluminum. Core layer 2 provides structural support for the alternately disposed dielectric and conductive layers. Typically, core layer 2 is electrically grounded when the laminated substrate is assembled as an interconnection circuit device in an integrated circuit package.

The conductive and dielectric layers shown in FIG. 1 are disposed symmetrically about core layer 2. That is, each dielectric or conductive layer formed on one side of core layer 2 has a corresponding layer of the same material formed on the opposite side of core layer 2. Consequently, the following description sets forth a method for forming vias with respect to only one side of core layer 2, but a similar approach is used for forming vias on the other side of core layer 2. Additionally, while the laminated substrate shown in FIG. 1 has only two dielectric layers and two conductive layers symmetrically formed on each side of core layer 2, the laminated substrate of the present invention can have any number of alternately disposed dielectric and conductive layers symmetrically formed on opposite sides of the core layer.

Dielectric layers 3, 4, 7, and 8 are preferably made from laminates of high-temperature organic dielectric substrate materials, such as, but not limited to, polyimides and polyimide laminates, epoxy resins, organic materials, or dielectric materials comprised at least in part of polytetrafluoroethylene, with or without a filler. A more detailed description of these materials is provided hereinbelow. Conductive layers 5, 6, 9 and 10 are preferably formed from a conductive material, such as copper.

Dielectric layers 3 and 4 are laminated onto core layer 2 by placing the core between two sheets of dielectric material and pressing them together. When core layer 2 is made of copper, copper oxide layers 2a and 2b, commonly known as a brown, black or red oxide, are preferably provided on opposite surfaces of core layer 2 for promoting adhesion of dielectric layers 3 and 4 to core layer 2. Copper oxide layers 2a and 2b are formed on the core layer 2 by using standard surface treatment techniques, such as immersing the core layer in a brown oxide bath or a red oxide bath solution, commercially available from McGean Rohco, at a temperature of between 120° F. to 150° F. for between 30 seconds to 5 minutes.

Dielectric layers 3 and 4 are formed from an organic substrate material, such as a high-temperature organic dielectric substrate material, to have a thickness of between about 12 μm to 100 μm, inclusive. As a representative example, dielectric layers 3 and 4 could have a nominal thickness of about 50 μm.

Conductive layers 5 and 6 are stacked on top of dielectric layers 3 and 4 and laminated together in the first pressing operation, in which core 2, dielectric layers 3 and 4 and conductive layers 5 and 6 are pressed to form a laminated subassembly. In a second pressing operation, dielectric layers 7 and 8 and conductive layers 9 and 10 are stacked and pressed to form laminated substrate 1, shown in FIG. 1.

The conductive layers are made of a conductive material, preferably a ½ oz. copper layer having a nominal thickness of 19 μm. In the final interconnection circuit device, conductive layers 5 and 6 are typically power layers, but can also be signal layers. Design and application considerations determine the package construction.

When conductive layers 5 and 6 are made of copper, copper oxide layers 5a and 6a are formed on conductive layers 5 and 6, respectively, for promoting adhesion of dielectric layers 7 and 8 to conductive layers 5 and 6. Copper oxide layers 5a and 6a are formed on the conductive layers 5 and 6, respectively, by using known techniques, such as immersing the substrate in a brown oxide bath or a red oxide bath solution, commercially available from McGean Rohco, at a temperature of between 120° F. to 150° F. for between 30 seconds to 5 minutes.

Dielectric layers 7 and 8 are preferably formed from an organic substrate material, such as a high-temperature organic dielectric substrate material, to have a thickness of between about 12 μm to 100 μm, inclusive. As a representative example, dielectric layers 7 and 8 could have a nominal thickness of about 50 μm.

Conductive layers 9 and 10 are made of a conductive material, and are preferably a ⅛ oz. copper layers having a nominal thickness of 5 μm. Typically, conductive layers 9 and 10 are conventional signal/pad layers in the final interconnection circuit device, but can also be power/pad layers.

Laser System For Forming Vias

Figure 3:
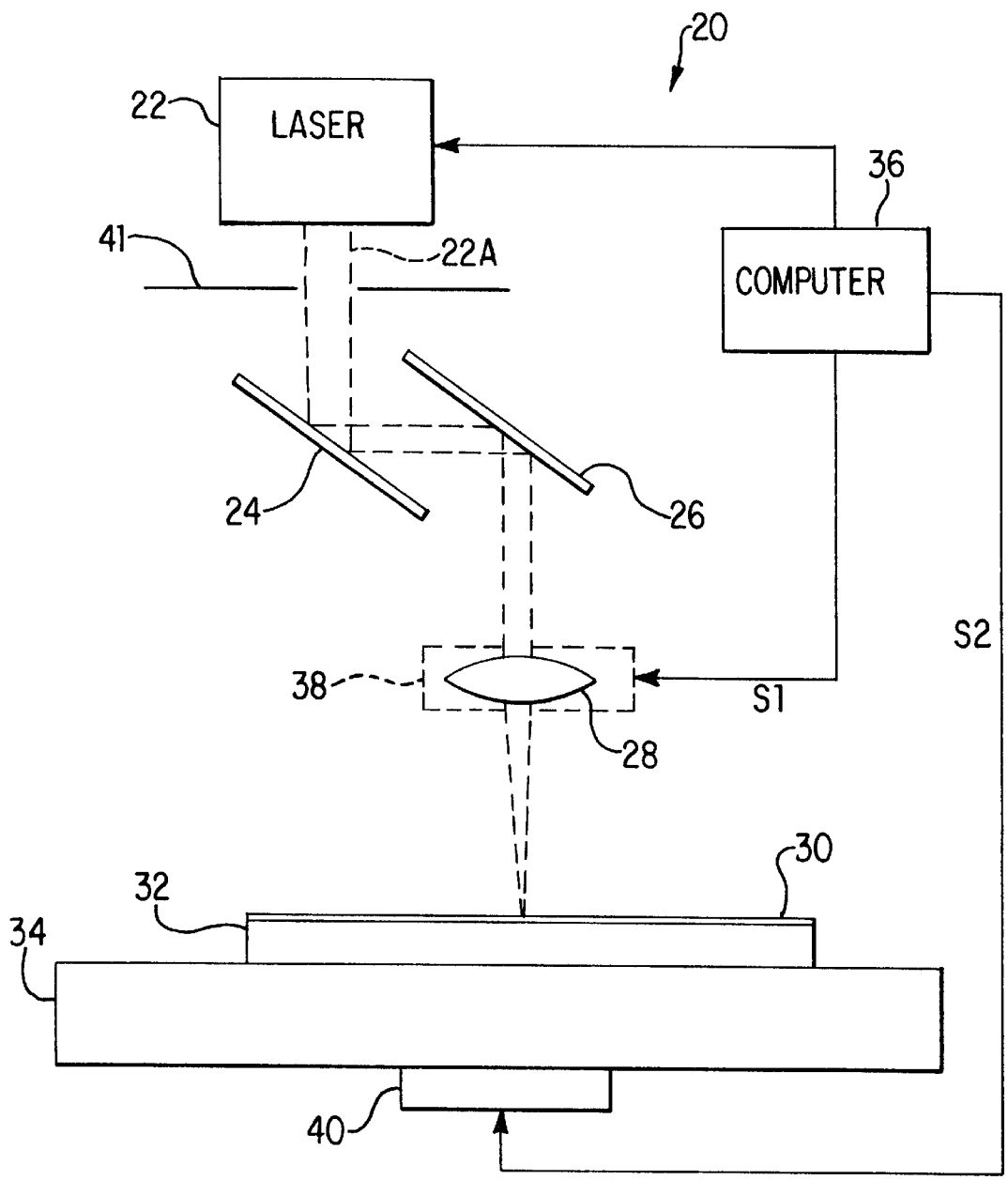
FIG. 3 is a schematic view of a laser system for forming vias according to the present invention.

The vias shown in FIG. 1 are formed using the laser system 20 shown in FIG. 3. Laser system 20 includes a laser source 22 which outputs a pulsed laser beam 22a that is directed through a laser optic system. The optic system includes mirrors 24 and 26, and a focusing lens 28 which directs a focused beam through a patterned mask 30, used when blind-vias are formed, onto a workpiece 32 positioned on an X-Y positioning table 34. The focused beam forms a focal spot on the substrate underlying the mask 30. The focal spot can be circular or oval in shape.

Workpiece 32 of FIG. 3 is a laminated substrate that includes a plurality of alternately disposed dielectric and conductive layers, such as the laminated substrate 1 shown in FIG. 1. After additional laminations are applied, the blind-vias or through-vias formed in one step become buried vias. Blind-vias can also be formed on the bottom-most or top-most dielectric layer, as exemplified by blind-via 11 of FIG. 1.

Laser system 20 includes a controlling device, such as computer 36, that controls the position of the focal spot of the laser beam with respect to workpiece 32. Computer 36 controls the positioning of the focal spot by issuing control signals S1 to an actuator 38 which moves lens 28 in the X direction. Computer 36 further issues control signals S2 to an actuator 40 which moves the positioning table 34 in the Y direction. The combined X and Y motion allows system 20 to move the laser beam in a manner programmed by computer 36 to form a desired type of via.

Other X-Y positioning may be employed, including galvanometers for controlling the position of mirrors 24 and 26. Galvanometers of this type are commercially available and can be installed in commercially available laser apparatuses. In any event, computer 36 can be pre-programmed for establishing the pattern of motion of the beam spot to form the desired vias. Moreover, computer 36 is operatively coupled to laser source 22 for establishing lasing parameters such as direction, speed of the beam path (in millimeters per second), pulse repetition rate, and power.

To adjust peak pulse power, computer 36 can implement a change in pulse repetition frequency, which affects peak power both by changes in average power and pulses per second, as well as the pulse duration in ns. This is best done by changing pulse intervals with electronic or acousto-optic Q-switching. Power per pluse can also be changed by adjusting the current to the laser excitation source, such as in arc lamp.

The preferred pattern of movement of the laser focal spot is "trepanning" the spot, in which the beam spot starts in the center of the desired via, and gradually spirals outwardly to an outer diameter of the via. At that point the beam is caused to orbit around the via center for as many revolutions as is determined necessary for the particular via. Upon completion, the focal spot is caused to spiral back to the center and thereafter awaits the next command. An example of a trepanning velocity is 3 millimeters per second.

Choice of laser is important to the present invention. The preferred lasers are pulsed solid state lasers such as the frequency-tripled Nd:YAG (neodymium yttrium aluminum garnet) laser emitting at a 355 nm wavelength or a frequency-quadrupled Nd:YAG laser emitting at a 266 nm wavelength. Such lasers are commercially available as the Model 5000 Laser Processing System produced by Electro Scientific Industries of Portland, Oreg., USA.

FIG. 4 is a graph showing an example of laser output power as a function of pulse repetition frequency for laser source 22. As is evident therefrom, there is a non-linear relationship between average power and frequency, but up to a maximum value of average power, the pulse frequency can be increased to provide increased average power.

In changing the laser energy density in situ, the computer can control the Q-switch to vary the pulse repetition rate. Table 1 demonstrates how the laser energy and power change with repetition rate for the 355 nm Nd:YAG laser:

TABLE 1

| Rep. Rate (Hz) | Average Power (mW) | Pulse Width (nm) | Energy per Pulse (mJ) | Power per Pulse (kW) |
|---|---|---|---|---|
| 2000 | 680 | 40 | 340 | 8.5 |
| 3000 | 770 | 48 | 255 | 5.3 |
| 4000 | 770 | 55 | 195 | 3.5 |
| 5000 | 725 | 63 | 145 | 2.3 |
| 6000 | 685 | 70 | 115 | 1.6 |
| 7000 | 630 | 78 | 90 | 1.2 |
| 8000 | 580 | 85 | 75 | .9 |
| 9000 | 535 | 93 | 60 | .6 |
| 10000 | 500 | 100 | 50 | .5 |

Similarly, Table 2 demonstrates how the laser energy and power with repetition rate for the 266 nm Nd:YAG laser:

TABLE 2

| Rep. Rate (Hz) | Average Power (mW) | Pulse Width (nm) | Energy per Pulse (mJ) | Power per Pulse (kW) |
|---|---|---|---|---|
| 2000 | 330 | 40 | 165 | 4.1 |
| 3000 | 380 | 48 | 125 | 2.6 |
| 4000 | 350 | 55 | 90 | 1.6 |
| 5000 | 290 | 63 | 60 | 1.0 |
| 6000 | 280 | 70 | 45 | 0.6 |
| 7000 | 240 | 78 | 35 | 0.4 |
| 8000 | 180 | 85 | 25 | 0.3 |
| 9000 | 140 | 93 | 15 | 0.2 |
| 10000 | 130 | 100 | 15 | 0.1 |

When the laser focal spot geometry is added to the above, energy density can be calculated. The energy density is one of the primary parameters for setting laser ablation of the substrates to form vias in the organic substrates described herein.

Method of Laser Drilling Blind-Vias

Figure 5A:
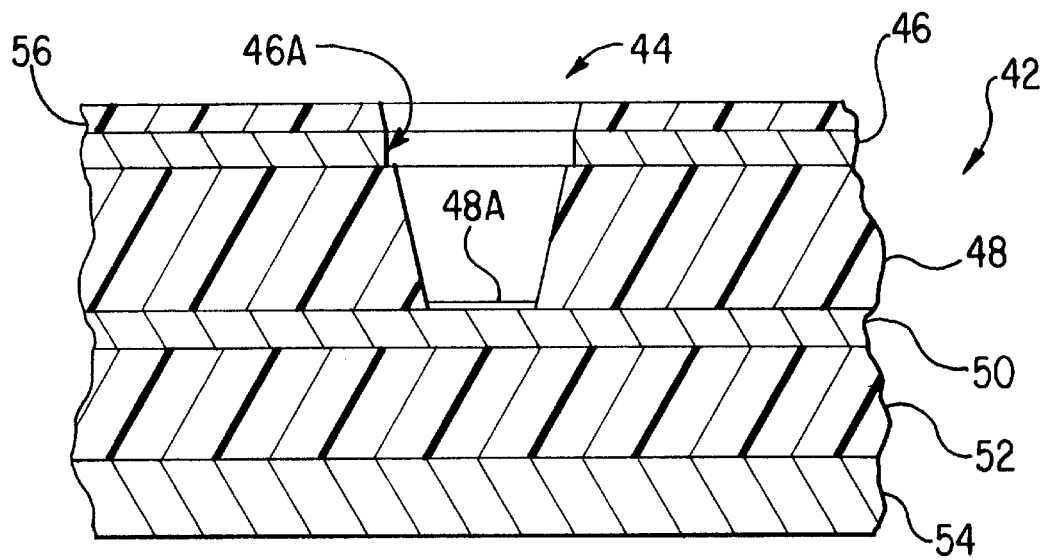
FIGS. 5A and 5B are sectional views showing a multilayered substrate having a blind-via formed therein, with FIGS. 5A and 5B showing different stages of development of the blind-via.

Referring to FIG. 5A, a laminated multilayered substrate 42 includes a blind-via 44 formed therein according to the methods and laser drilling apparatus of the present invention. Typically, blind-vias are formed through only one dielectric layer and are used for routing connections between two adjacent conductive layers. However, blind-vias can be formed using the present invention that go through a plurality of laminated substrate layers in order to connect multi-conductive layers.

The range of aspect ratios for blind-vias that are achievable by the present invention is 1:1 to 5:1, inclusive. For example, a blind-via may be formed having a via entrance width of 50 μm and extending through a dielectric layer having a thickness of 50 μm (1:1).

As seen in FIG. 5A, laminated substrate 42 includes an outer conductive layer 46 having a preformed aperture 46a formed at the location where blind-via 44 is to be formed. Substrate 42 further includes a dielectric layer 48, a conductive layer 50, a dielectric layer 52 and a conductive layer 54. Aperture 46a is formed by conventional means, such as by a chemical etching process, so that dielectric layer 48 is exposed through aperture 46a. In particular, conductive layer 46 is coated with a photo-absorptive material, and then the photo-absorptive materials are imaged with a pattern for aperture 46a. The imaged photo-absorptive layer is developed and the exposed portion of conductive layer 46 is chemically etched to form aperture 46a.

After aperture 46a is formed, the photo-absorptive material used to image conductive layer 46 and form opening 46a can be left on, rather than being etched away, to leave a polymeric photo-absorptive layer 56 on conductive layer 46. Photo-absorptive layer 56 is between 5 μm and 50 μm thick and, preferably, is nominally 25 μm thick. Suitable photo-absorptive materials are any of a variety of commercially available photoresists.

With photo-absorptive layer 56 in place, substrate 42 is then placed on the positioning table 34 of FIG. 3. The laser beam is positioned so that laser focal spot is focused to a predetermined spot size inside of aperture 46a where blind-via 44 is to be drilled. The output power level, the pulse repetition frequency, the pulse length or duration and laser focal spot size are adjusted accordingly so that an energy density per pulse is applied to substrate 42, and more specifically, to dielectric layer 48, that is greater than an ablation energy density threshold of dielectric layer 48, but is less than an ablation energy density threshold of conductive layer 50 (located below dielectric layer 48).

When using a 355 nm laser source, the beam ablates material in the blind-via to a point where the beam begins to be partially reflected by the underlying conductive layer 50, and thus, further exposure to the beam forms an undesirable copper oxide due to local heating. At this point, a post-pulse processing technique is used for further processing blind-via 44 to completely remove any remaining dielectric material 48a. Complete removal provides a reduced resistance and resistance variance of via 44.

For post-pulse processing, the output power level of laser 22 is increased in situ over the drilled via to an energy density level per pulse that exceeds the ablation threshold of conductive layer 50 by adjusting the energy density of the laser beam. The number of pulses and peak power of each pulse applied to conductive layer 50 at the increased energy density is selected so that the surface of conductive layer 50 at the bottom of blind-via 44 becomes molten, but is not rapidly ablated and drilled. Since the energy density per pulse has been increased, the remaining dielectric layer 48a is completely ablated.

The material from dielectric layer 48 that is ablated during laser drilling is vaporized and pulled through a local source of exhaust, or is redeposited on polymeric photo-absorptive layer 56 surrounding aperture 46a. After via 44 achieves the depth shown in FIG. 5a, photo-absorptive layer 56 and the ablated material redeposited thereon are removed using known techniques, such as chemically stripping. The blind-via shown in FIG. 2a was formed using a photo-absorptive layer on the surface of the laminated substrate before laser drilling. When the energy density per pulse applied to the substrate is larger than what is needed for drilling a via, nodules, or beads, are formed on conductive layer 48 around the via entrance that adversely affect the overall yield and the reliability of an interconnection circuit device.

For the initial drilling of a blind-via, laser source 22 (FIG. 3) can be adjusted to have a desired power output and pulse repetition frequency, such as between 1 KHz and 15 KHz, inclusive.

When the laser is a tripled Nd:YAG laser emitting at a wavelength of 355 nm, the energy density per pulse applied to dielectric layer 48 (FIG. 5a) is between 0.5 J/cm$^2$ and 11 J/cm$^2$, and preferably is nominally 5 J/cm$^2$. When dielectric layer 48 is made of a ePTFE matrix material, the energy density per pulse is preferably between 3 J/cm$^2$ and 4 J/cm$^2$. When dielectric layer 48 includes a filler, the energy density per pulse is preferably about 7 J/cm$^2$. When the laser emits at a 355 nm wavelength, the laser is preferably adjusted to have a pulse repetition frequency of 6000 Hz, a pulse width of 70 ns, and a spot size of 35 µm for a 50 µm diameter via entrance. Pulse widths, as used herein, neglect rise and fall times of a pulse. Spot sizes, as used herein, are approximately 1/e$^2$ sizes. Other pulse repetition frequencies may also be used with pulse widths that are typically less than 100 ns, as long as a sufficient energy density per pulse for ablating dielectric layer 48 is applied.

When the laser is a quadrupled Nd:YAG laser emitting at a wavelength of 266 nm, the energy density per pulse applied to dielectric layer 48 is between 0.2 J/cm$^2$ and 3 J/cm$^2$, and preferably is nominally 2 J/cm$^2$. When the laser emits at a 266 nm wavelength, it is preferably adjusted to have a pulse repetition frequency of 7000 Hz, a pulse width of 78 ns, and a spot size of 30 µm for a 50 µm diameter via mask entrance. Other pulse repetition frequencies may also be used with pulse widths that are typically less than 100 ns as long as a sufficient energy density per pulse for ablating dielectric layer 48 is applied.

The laser beam is preferably applied to dielectric layer 48 within aperture 46a without trepanning, that is, moving the laser focal spot as the blind-via is being drilled. Alternatively, the laser focal spot can be trepanned in a circular motion within aperture 46a to form a via having a circular cross-section. Specifically, the focal spot is initially focused to the center point of where the via is to be drilled. As the laser is pulsed, lens 28 and table 34 move in a coordinated fashion so that the focal spot is spirally trepanned outward to a circle having a predetermined diameter, and then trepanned around the circle for as many times as are needed to drill the via, and then spirally trepanned back to the center point before the operating conditions of the laser are changed, or the focal spot is moved to another via. The rate of trepan and the corresponding spacing between each pulse is related to the pulse repetition frequency and the per-pulse power level output from the laser.

For post-pulse processing, the laser power density, repetition rates, and pulse lengths are varied according to specific needs and drilling operations. Some representative values for different lasers for blind-via post-pulse processing are provided in detail hereinafter.

When the laser 22 is a tripled Nd:YAG laser emitting at a wavelength of 355 nm, the energy density per pulse applied to conductive layer 50 for post-pulse processing is greater than 5.5 J/cm$^2$, and preferably is nominally 11 J/cm$^2$. At this wavelength, the laser is adjusted to have a pulse repetition frequency of 4000 Hz, and a pulse length of 55 ns. A focal spot size of 35 µm is employed. Typically, between 1 and 10 pulses, inclusively, are used for 355 nm post-pulse processing. Other pulse repetition frequencies may also be used with pulse widths that are typically less than 100 ns as long as a sufficient energy density per pulse for ablating conductive layer 50 is applied to conductive layer.

When the laser 22 is a quadrupled Nd:YAG laser emitting at a wavelength of 266 nm, the energy density per pulse applied to conductive layer 50 is greater than 1.5 J/cm$^2$, and preferably is nominally 5 J/cm$^2$. When the laser 22 emits at a 266 nm wavelength, the laser beam is preferably adjusted to have a pulse repetition frequency of 5000 Hz, a pulse length of 63 ns, and a spot size of 30 µm. Similarly, between 1 and 10 pulses, inclusively, are used for 266 nm post-pulse processing. Other pulse repetition frequencies may also be used with pulse lengths that are typically less than 100 ns as long as a sufficient energy density per pulse for ablating dielectric layer 50 is applied.

Figure 5B:
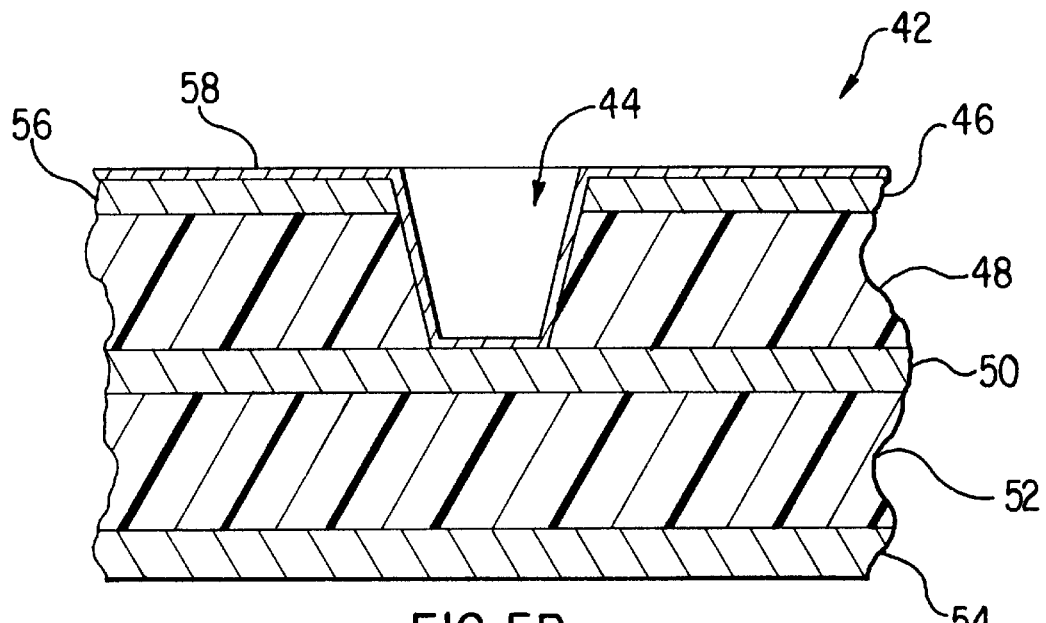

After post-pulse processing, and as shown in FIG. 5B, blind-via 44 is plated with a conductive material which forms a conductive layer 58 using known techniques such as electroless plating. This plating provides an electrical interconnection between the two adjacent conductive layers 46 and 50.

Figure 6A:
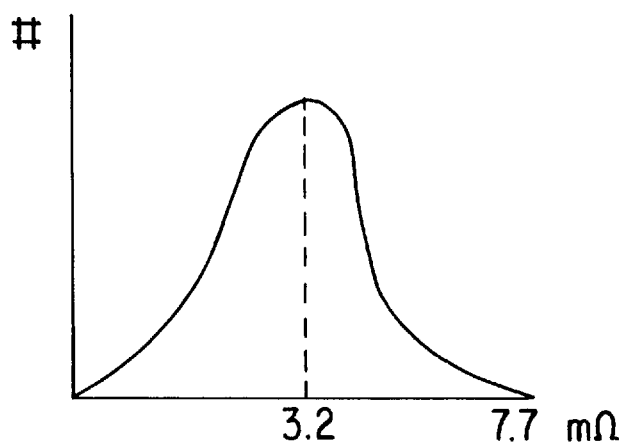
FIGS. 6A and 6B are graphs showing average resistance of a blind-via without post-pulse treatment and with post-pulse treatment, respectively.

Blind-vias post-pulse processed according to the methodology of the present invention have a reduced average resistance after the conductive material is plated into the blind-via as compared to blind-vias that have not been post-pulse processed. When vias not receiving the post-pulse processing according to the present invention were tested, an average resistance of a blind-via was measured at about 3 mΩ. With post-pulse processing, a comparably produced blind-via had an average resistance of about 2 mΩ. Data taken from the tests are roughly reproduced in graphic form in FIGS. 6A and 6B, which show average resistance for different power levels per pulse for blind-vias with (FIG. 6B) and without (FIG. 6A) post-pulse processing. In FIG. 6A, the average resistance of a blind-via produced with no post-pulse processing is 3.2 mΩ with a 3σ point of 7.7 mΩ. Additionally, the data showed that the variance of blind-via resistance, an important process factor, using post-pulse processing according to the present invention, is reduced from 2.4 mΩ$^2$ to 0.3 mΩ.

Figure 6B:
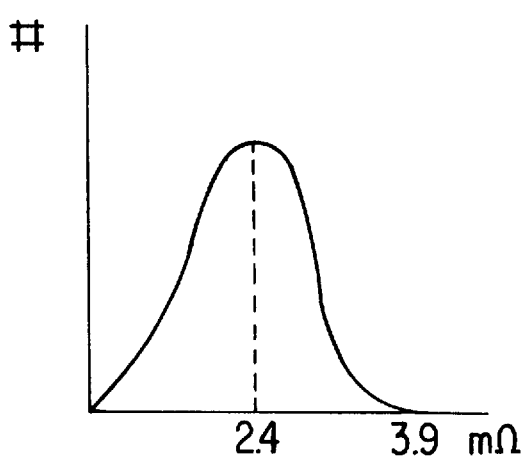

FIG. 6B graphically shows that with post-pulse processing the average resistance is 2.4 mΩ with a 3σ point of 3.9 mΩ. Thus, post-pulse processing of the present invention reduces the average resistance of a blind-via and significantly reduces the distribution of resistances obtained, providing extremely high part yields and well-controlled resistive qualities of blind-vias in an interconnection circuit device.

Tables 3–12 set forth results of a test in which multiple panels of laminated substrates were laser drilled for producing blind-vias having via entrance diameters of 50 µm and an aspect ratio of 1:1 in a Speedboard® C dielectric material, using a quadrupled Nd:YAG laser emitting at a 266 nm wavelength and with a 25 μm spot size. The experimental matrix was a full factorial design comprising 108 blind-via laser conditions. Each group of vias per laser drilled conditions used one of three laser output energy levels, 175 mW, 200 mW and 225 mW. Power was set for the laser rail at 3000 Hz. Each group of blind-vias was subdivided into 3 subgroups that were drilled at one of three pulse repetition frequencies, 6000 Hz, 7000 Hz and 8000 Hz. Pulse width varied between 70 ns for 6000 Hz to 85 ns for 8000 Hz, so that between 5 μJ per pulse and 15 μJ per pulse was applied to the dielectric. Each subgroup of vias was further subdivided into 3 sub-sub groups that were drilled using one of three predetermined number of pulses, 75, 150 and 225. One half of each sub-subgroup was post-pulse processed, while the other half was not post-pulse processed. Post-pulse processing changed the laser conditions in situ over a blind-via so that about 25 μJ per pulse was applied to the substrate.

The average resistance for both panels for all conditions was measured to be 2.83 mΩ. The average resistance for both panels for non-post-pulse processed blind-vias was measured to be 3.22 mΩ. The average resistance for both panels for post-pulse processed blind-vias was measured to be 2.43 mΩ. Table 3 sets forth the average resistance measured for each of the three different energy levels. Table 3 generally shows that an output energy level of 175 mW did not sufficiently ablate all dielectric material from a blind-via, resulting in a higher measured resistance.

TABLE 3

| POWER SETTING LEVEL @ 3000 Hz (mW) | AVERAGE RESISTANCE (mΩ) |
|---|---|
| 175 | 4.11 |
| 200 | 2.26 |
| 225 | 2.11 |

Table 4 sets forth the average resistance measured for each of the three different pulse repetition frequencies. Table 4 shows that a higher pulse repetition frequency, with a correspondingly longer pulse width and lower power level, did not sufficiently ablate the dielectric material from a blind-via, resulting in a higher measured resistance.

TABLE 4

| PULSE REPETITION FREQUENCY (Hz) | AVERAGE RESISTANCE (mΩ) |
|---|---|
| 6000 | 1.73 |
| 7000 | 2.23 |
| 8000 | 4.51 |

Table 5 sets forth the average resistance measured for each of the three different predetermined number of pulses used for drilling a via. Table 5 shows that when 75 pules were used for drilling a via for all output energy levels, the dielectric material was not sufficiently ablated from a blind-via, resulting in a higher measured resistance.

TABLE 5

| NUMBER OF PULSES | AVERAGE RESISTANCE (mΩ) |
|---|---|
| 75 | 3.89 |
| 150 | 2.36 |
| 225 | 2.22 |

Table 6 forth average resistance measured for no post-pulse processing and for post-pulse processing. Table 6 shows that post-pulse resistance for all output energy levels and all pulse repetition used.

TABLE 6

| POST-PULSE PROCESSING | AVERAGE RESISTANCE (mΩ) |
|---|---|
| NO | 3.22 |
| YES | 2.43 |

Table 7 sets forth the average resistance measured as a function of output energy level and pulse repetition frequency. Table 7 shows that a lower pulse repetition frequency, with a correspondingly shorter pulse width and higher power level, provided a lower average resistance.

TABLE 7

| POWER SETTING LEVEL @ 3000 Hz (mW) | PULSE REPETITION FREQUENCY (Hz) | AVERAGE RESISTANCE (mΩ) |
|---|---|---|
| 175 | 6000 | 1.82 |
| 175 | 7000 | 2.51 |
| 175 | 8000 | 7.99 |
| 200 | 6000 | 1.66 |
| 200 | 7000 | 2.11 |
| 200 | 8000 | 3.00 |
| 225 | 6000 | 1.71 |
| 225 | 7000 | 2.08 |
| 225 | 8000 | 2.54 |

Table 8 sets forth the average resistance measured as a function of output energy level and number of pulses used. Table 8 shows that a lower output energy level and a lower number of pulses used for drilling provided a higher average resistance.

TABLE 8

| POWER SETTING LEVEL @ 3000 Hz (mW) | NUMBER OF PULSES | AVERAGE RESISTANCE (mΩ) |
|---|---|---|
| 175 | 75 | 6.93 |
| 175 | 150 | 2.83 |
| 175 | 225 | 2.56 |
| 200 | 75 | 2.53 |
| 200 | 150 | 2.17 |
| 200 | 225 | 2.07 |
| 225 | 75 | 2.23 |
| 225 | 150 | 2.09 |
| 225 | 225 | 2.03 |

Table 9 sets forth the average resistance measured as a function of whether post-pulse processing was used. Table 9 shows that use of post-pulse processing decreased average resistance for all output energy levels used. As previously mentioned, FIGS. 6A and 6B show a graph of average resistance for different power levels per pulse for blind-vias with and without post-pulse processing for the data of Table 9.

TABLE 9

| POWER SETTING LEVEL @ 3000 Hz (mW) | POST-PULSE PROCESSING | AVERAGE RESISTANCE (mΩ) |
|---|---|---|
| 175 | NO | 4.89 |
| 175 | YES | 3.31 |
| 200 | NO | 2.49 |
| 200 | YES | 2.02 |
| 225 | NO | 2.27 |
| 225 | YES | 1.96 |

Table 10 sets forth the average resistance measured as a function of pulse repetition frequency and whether post-pulse processing was used. Table 10 shows that a post-pulse processing decreased the average resistance for all pulse repetition frequencies used.

TABLE 10

| PULSE REPETITION FREQUENCY (Hz) | POST-PULSE PROCESSING | AVERAGE RESISTANCE (mΩ) |
|---|---|---|
| 6000 | NO | 1.83 |
| 6000 | YES | 1.64 |
| 7000 | NO | 2.41 |
| 7000 | YES | 2.06 |
| 8000 | NO | 5.42 |
| 8000 | YES | 3.60 |

Table 11 sets forth average resistance measured as a function of number of pulses used and whether post-pulse processing was used. Table 11 shows that post-pulse processing decreased the average resistance for the different total number of pulses used.

TABLE 11

| NUMBER OF PULSES | POST-PULSE PROCESSING | AVERAGE RESISTANCE (mΩ) |
|---|---|---|
| 75 | NO | 4.58 |
| 75 | YES | 3.21 |
| 150 | NO | 2.61 |
| 150 | YES | 2.11 |
| 225 | NO | 2.46 |
| 225 | YES | 1.98 |

Table 12 sets forth the standard deviation for the average resistance measured for whether post-pulse processing was used. Table 12 shows that post-pulse processing reduced the standard deviation of resistances measured by a factor of 3. FIG. 6A graphically shows that the average resistance of a blind-via produced with no post-pulse processing is 3.2 mΩ with a 3σ point of 7.7 mΩ. FIG. 6B graphically shows that with post-pulse processing the average resistance is 2.4 mΩ with a 3σ point of 3.9 mΩ.

TABLE 12

| POST-PULSE PROCESSING | AVERAGE RESISTANCE (mΩ) |
|---|---|
| NO | 1.54 |
| YES | 0.54 |

While the laser power density, repetition rates, and pulse widths can be varied according to specific needs and drilling operations, some representative values for the 355 nm Nd:YAG laser with a 35 μm spot size are provided as follows in Table 13.

TABLE 13

| Dielectric Material | Energy per Pulse (μJ) | Energy Density (J/cm$^2$) | Power Density (MW/cm$^2$) |
|---|---|---|---|
| CE-epoxy/PTFE | 30 | 3.5 | 35 |
| post-pulse | 100 | 11 | 200 |
| CE-epoxy/PTFE/ceramic filler | 65 | 7.0 | 100 |
| post-pulse | 100 | 11 | 200 |

Similarly, for the 266 nm wavelength Nd:YAG laser, representative values for forming a blind-via with a 30 μm focal spot are as follows in Table 14.

TABLE 14

| Dielectric Material | Energy per Pulse (μJ) | Energy Density (J/cm$^2$) | Power Density (MW/cm$^2$) |
|---|---|---|---|
| CE-epoxy/PTFE | 10 | 1.5 | 20 |
| post-pulse | 20 | 3 | 40 |

For dielectric materials having ceramic filler, higher values are required. For instance, the energy density applied to conductive layer 50 is greater than 4 J/cm$^2$, and preferably is nominally 9 J/cm$^2$. These values correspond to a pulse repetition frequency of 5000 Hz, a pulse length of 55 ns, and a spot size of 30 μm. For the post-pulse step, between 1 and 10 pulses, inclusively, are used. Other pulse repetition frequencies may also be used with pulse lengths that are typically less than 100 ns as long as a sufficient energy density per pulse for ablating dielectric layer 50 is applied.

Forming blind-vias according to the methodology described above minimizes damage to the mask (layer 30 in FIG. 3), as well as the copper oxide layers associated with conductive layers 2a, 2b, 5a and 6a of FIG. 1 and those that would be associated with conductive layers 50 and 54 of FIG. 5A and 5B, the latter being excluded from illustration for clarity. The minimized damage results from minimizing the amount of peak power used for drilling a via. The copper oxide layer is not partially etched back when the laminated substrate is cleaned after laser drilling in an acidic cleaner, thus resulting in a more reliable via because the copper and dielectric layers in the substrate remain adhered to each other in the vicinity of the via.

Methods For Forming Through-Vias

The present invention further entails the formation of through-vias using the laser drilling apparatus shown in FIG. 3. It is possible, using the present techniques, to drill through-vias having entrance diameters of 75 μm or less and aspect ratios of between 3:1 and 25:1.

Figure 7A:
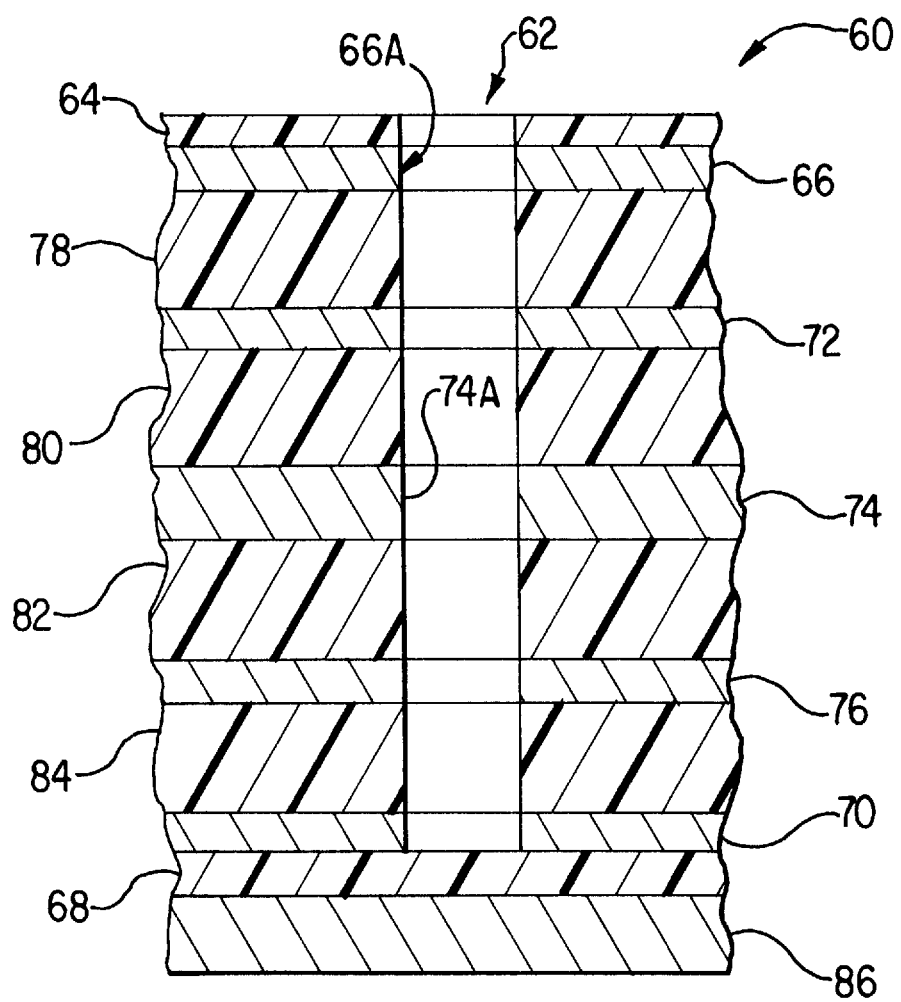
FIGS. 7A and 7B are sectional views showing a through-via in different stages of development.

Referring to FIG. 7A, a laminated substrate 60 is shown with a through-via 62 passing through alternating layers of dielectric and conductive layers. When the through-via 62 is drilled, the conductive and the dielectric layers are drilled at the same time, as described below.

Laminated substrate 60 in FIG. 7A is formed with a polymeric photo-absorptive coating 64 on an upper most conductive layer 66. This photo-absorptive coating is the same type described with respect to FIG. 5A, and can be applied using a roll lamination, a spray coating, or a spin-coating technique, for example. Coating 64 is between 5 μm and 50 μm thick and, preferably, nominally 25 μm thick. Suitable photo-absorptive materials for the coating are commercially available. When the photo-absorptive layer is removed after laser drilling, the via entrance is of high-quality since ablated material deposits on layer 64 and is removed.

To form a via exit of high quality, that is, a low exit width variance, a polymeric photo-absorptive layer 68 is formed on the bottom most exposed conductive layer 70 using a known technique, such as a roll lamination, a spray coating or a spin coating process. Photo-absorptive layer 68 has a thickness of between 5 $\mu$m to 50 $\mu$m, and preferably has a nominal thickness of 25 $\mu$m. A series of intermediate alternating layers of conductive layers 72, 74, and 76 and dielectric layers 78, 80, 82 and 84 are provided between the upper most and lower most conductive layers 66 and 70.

It is important to maintain planarity of the bottom side of laminated substrate 60 during the process of laser drilling to form through-via 62. Conventional approaches of holding a laminated substrate against a screen or a honeycomb grid using a vacuum does not provide the required combination of sufficient bottom side planarity and minimal redeposit of material conformal to the bottom side of the substrate. Most vacuum plates are fabricated with aluminum or steel, thus providing a potential for redeposit of metal that is difficult to remove. In some instances, photo-absorptive layer 68 alone is sufficient for providing high-quality via exits. To ensure both an easy to remove redeposit material with via sidewalls, as well as the necessary bottom side planarity, a layer 86 made of conductive material, such as copper, is placed in intimate contact with photo-absorptive layer 68 by taping substrate 60 coated with photo-absorptive layer 68 to a flat conductive plate, such as copper.

To laser drill through-via 62 shown in FIG. 7A, substrate 60 is positioned so that the laser focal spot is focused to predetermined X and Y coordinates where through-via 62 is to be drilled. For a through-via having a 50 $\mu$m diameter, the output power level, the pulse repetition frequency, the pulse width and laser focal spot size of the laser are adjusted accordingly so that an energy density per pulse is applied to substrate 60 that is greater than an ablation energy density threshold of the conductive layers 66, 72, 76 and 70. For example, the computer of the laser system shown in FIG. 3 sets the power output and the pulse repetition frequency between 1 KHz and 15 KHz, inclusive, and a pulse length of between 40 ns and 100 ns, inclusive, utilizing a laser spot size of between 25 $\mu$m and 35 $\mu$m in diameter, for example, to ablate the layers of substrate 60.

When the laser is a tripled Nd:YAG laser emitting at a wavelength of 355 nm, the energy density per pulse applied to substrate 60 is greater than 2 J/cm$^2$, and preferably is nominally 10 J/cm$^2$. For a 355 nm wavelength output, the laser is preferably adjusted to have a pulse repetition frequency of 8000 Hz, a pulse width of 85 ns and a spot size of 35 $\mu$m. Other pulse repetition frequencies may also be used with pulse widths that are typically less than 100 ns as long as a sufficient energy density per pulse for ablating the layers of the substrate 60 is applied.

Some other representative through-via forming parameters for the 355 nm wavelength laser are as follows in Table 15:

TABLE 15

| Dielectric Material | Energy per Pulse ($\mu$J) | Energy Density (J/cm$^2$) | Power Density (MW/cm$^2$) |
| --- | --- | --- | --- |
| ceramic filled CE-epoxy/PTFE | 75 | 8 | 95 |

TABLE 15-continued

| Dielectric Material | Energy per Pulse ($\mu$J) | Energy Density (J/cm$^2$) | Power Density (MW/cm$^2$) |
| --- | --- | --- | --- |
| CE-woven glass/CE-Epoxy/PTFE | 200 | 22 | 400 |

When the laser is a quadrupled Nd:YAG laser emitting at a wavelength of 266 nm, the energy density per pulse applied to the substrate is greater than 2 J/cm$^2$, and preferably is nominally 10 J/cm$^2$. For a 266 nm wavelength output, the laser is preferably adjusted to have a pulse repetition frequency of 5000 Hz, a pulse width of 55 ns and a spot size of 25 $\mu$m. Other pulse repetition frequencies may also be used with pulse widths that are typically less than 100 ns as long as a sufficient energy density per pulse for ablating the layers of the substrate 60 is applied. Other representative values for through-via formation using a 266 nm wavelength Nd:YAG laser with a 25 mm focal spot are as follows in Table 16.

TABLE 16

| Dielectric Material | Energy per Pulse ($\mu$J) | Energy Density (J/cm$^2$) | Power Density (MW/cm$^2$) |
| --- | --- | --- | --- |
| ceramic filled CE-epoxy/PTFE | 50 | 10 | 150 |

To form the through-via of FIG. 7A, the laser beam is preferably applied to substrate 60 in a trepanned motion as was described with respect to formation of the blind-via. This results in the formation of a through-via having a circular cross-section. The trepanning motion continues for as long as is necessary to drill the through-via, and then the focal spot is spirally trepanned back to the center point before the operating conditions of the laser are changed, or focal spot is moved to another via. To form a 50 $\mu$m diameter via, the center of a 25 $\mu$m diameter focal spot is trepanned in a 40 $\mu$m diameter circular pattern at a trepanning distance of 0.8 to 6 $\mu$m between pulses.

Figure 7B:
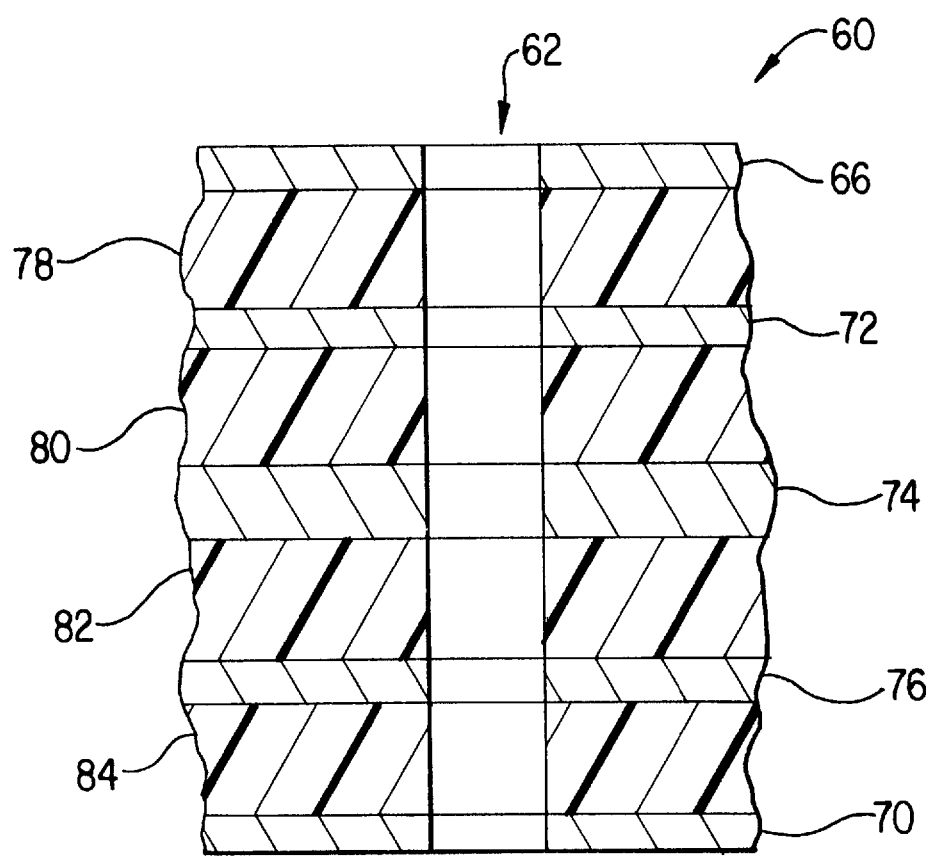

When through-via 62 is drilled through to the bottom side of substrate 60, minimal redeposit on the sidewalls occurs due to the high UV-VIS (ultraviolet-visible) absorptivity of the polymer coating on the via exit and conductive layer 86 after ablation-redeposit. Once drilling is complete, conductive layer 86 is separated from substrate 60 and photo-absorptive layer 68 is stripped away using known techniques. Also, photo-absorptive coating 66 is stripped, resulting in substrate 60 shown in FIG. 7B.

Use of photo-absorptive layer 68 formed on the bottom surface of substrate 60 and conductive layer 86 held in intimate contact with the substrate ensures the formation of through-vias having a low exit width variance. For example, for through-vias having an aspect ratio of about 10:1, an exit width variance of about 20 $\mu$m$^2$ has been measured. As another example, an exit width variance of about of about 30 $\mu$m$^2$ has been measured for through-vias having an aspect ratio of about 20:1.

Multi-frequency Processing And Multiple Pulse Spacing

Many times when a through-via is initially drilled, the via exit opening at the bottom conductive layer 70 (FIG. 7A and 7B) is smaller than the via entrance opening at the upper conductive layer 66. Both nominal exit diameter and through-via exit width variance can be further improved by performing post-pulse processing. That is, the laser system output conditions are changed in situ over through-via 62 after the via is drilled in one of four ways and the laser beam is then trepanned for an additional trepanning pass typically using a smaller trepanning circle pattern.

To illustrate the four different through-via post-processing techniques, the situation where a 50 μm diameter through-via is drilled is considered. The through-via is initially drilled using an energy density per pulse of 50 μJ/pulse applied to the substrate at a pulse repetition rate of 5000 Hz, using a 25 μm spot size and a 40 μm diameter circular trepanning pattern at a trepanning distance of between pulses of 0.8 to 6 μm per pulse. In both through-via post-processing techniques, the laser output conditions are changed in situ over the through-via for avoiding tolerance build-up problems associated with repositioning the laser beam spot across the substrate and within entrances of the drilled through-vias. Re-lasing with multiple registration operations may result in severe entrance nodules and overall poor via quality.

For the first through-via post-pulse processing technique, the laser output conditions are adjusted in situ over the just-completed through-via by keeping the energy density per pulse constant at 50 μJ/pulse, the pulse repetition rate constant at 5000 Hz, the spot size constant at a 25 μm diameter, the trepanning rate constant at 0.8 to 6 μm spacing per pulse, but the trepanning pattern is reduced to be a 30 μm diameter circle.

For the second through-via post-pulse processing technique, the laser output conditions are adjusted in situ over the just-completed through-via by keeping the energy density per pulse constant at 50 μJ/pulse, the pulse repetition rate constant at 5000 Hz, the spot size constant at a 25 μm diameter, and by reducing the trepanning rate constant by a factor of 2.0 or greater to 0.4 to 3 μm spacing per pulse, and reducing the trepanning pattern to be a 30 μm diameter circle.

For the third through-via post-pulse processing technique, the laser output conditions are adjusted in situ over the just-completed through-via by increasing the energy density per pulse to 60 to 75 μJ/pulse, keeping the trepanning rate to be between 0.8 μm and 6 μm per pulse, and reducing the trepanning pattern to be a 30 μm diameter circle. This can be accomplished by changing the pulse repetition rate to approximately 4500 Hz.

For the fourth through-via post-pulse processing technique, the laser output conditions are adjusted in situ over the just-completed through-via by increasing the energy density per pulse to 60 to 75 μJ/pulse, reducing the trepanning rate by a factor of two or greater to 0.4 μm and 3 μm per pulse, and reducing the trepanning pattern to be a 30 μm diameter circle.

Through-via post-pulse processing provides a significant improvement in open through-via yield, while also providing an even further improved through-via exit width variance when compared to through-vias that are not post-pulse processed. For example, when the aspect ratio of the through-via is 5:1, a variance of about 5 μm² is achieved. Similarly, when the aspect ratio of the through-via is 10:1, a variance of the exit width of the through-via of about 10 μm² is achieved using through-via post-pulse processing. Similarly, when the aspect ratio of the through-via is 20:1, a variance of the exit width of the through-via of about 15 μm² is achieved.

The taper of the sidewalls of a via can be varied and is a function of the power level used to drill a via and the materials used in the substrate, the pulse step distance, and the total energy per via. Taper, for purposes of this disclosure is defined as:

$$\text{TAPER} = \frac{(D_1 - D_2)}{D_1}$$

where, $D_1$ is the entrance diameter of the a via, and $D_2$ is the exit diameter of the via. These diameters are shown in FIG. 1. Taper, defined in this manner, varies between 0 and 1. A taper of 0 indicates that the exit diameter equals the entrance diameter. A taper of 1 indicates that the via did not reach its destination. Taper for through-vias having an aspect ratio of 10:1 that are drilled in substrates having dielectric layers formed from paste composite dielectric materials can be formed having a taper from 0.0 to 0.4.

The laser conditions used for achieving this taper are initially drilling at a wavelength of 355 nm, an energy density per pulse of 75 μJ/pulse, a pulse repetition rate of 8000 Hz, a spot size of 35 μm, and a 40 μm diameter circular trepanning pattern at a trepanning rate of 2 μm to 3 μm between pulses. The resulting taper is approximately 0.3. Through-via post-pulse processing by either alternative discussed above can be used after the initial drilling.

Through-vias having an aspect ratio of 10:1 drilled in substrates having dielectric layers formed from woven glass dielectric materials can be formed having a taper of 0.2 to 0.5. The laser conditions used for achieving this taper are initially drilling at a wavelength of 355 nm, an energy density per pulse of 200 μJ/pulse, a pulse repetition rate of 3500 Hz, a spot size of 35 μm, and a 40 μm diameter circular trepanning pattern at a trepanning rate of 4 to 6 μm per pulse. Through-via post-pulse processing by either alternative is used after the initial drilling.

When a laser emitting at a wavelength of 266 nm is used, the taper achieved for a 10:1 ratio via for substrates having a ceramic/CE-epoxy PTFE dielectric material is 0.0 to 0.2. The laser conditions used for achieving this taper are initially drilling at a wavelength of 266 nm, an energy density per pulse of 50 μJ/pulse, a pulse repetition rate of 5000 Hz, a spot size of 25 μm, and a 40 μm diameter circular trepanning pattern at a trepanning rate of 2 μm to 3 μm between pulses. The resulting taper is approximately 0.1. Through-via post-pulse processing by either alternative discussed above can be used after the initial drilling.

Through-vias having an aspect ratio of 10:1 drilled in substrates having dielectric layers formed from woven glass dielectric materials can be formed having a taper of 0.1 to 0.3. The laser conditions used for achieving this taper are initially drilling at a wavelength of 266 nm, an energy density per pulse of 50–75 μJ/pulse, a pulse repetition rate of 4000-6000 Hz, a spot size of 35 μm, and a 40 μm diameter circular trepanning pattern at a trepanning rate of 1 to 6 μm per pulse. Through-via post-pulse processing by either alternative is used after the initial drilling.

Cleaning Blind-vias And Through-vias

After both blind-vias and through-vias have been laser drilled by the methods described above, and the photo-absorptive layers have been removed, a cleaning step is initiated. Since the via entrances formed by the present invention are 75 μm and less, conventional via cleaning does not remove the ablated material redeposited on the sidewalls of the vias to the degree necessary for reliably plating conductive material into the vias.

According to the present invention, an aggressive ultrasonic treatment in de-ionized water is used to clean the vias.

The ultrasonic treatment is typically carried out for between 5 and 20 minutes and is applied to the substrate for removing ablated material redeposited on sidewalls of the vias.

TEA & YAG Laser Processing

When a large number of blind-vias need to be drilled in a particular layer of a laminated substrate, that is, equal to or greater than 1500 blind-vias in an area about 45 mm$^2$, or a greater than or equivalent via density of 0.75 vias/mm$^2$, the blind-via laser processing described above can be implemented using a transversely excited atmospheric (pressure) (TEA) $CO_2$ laser in a scan mode operation for initially drilling each blind-via, and then using a solid state 3rd or 4th YAG laser in a drill mode operation for performing post-pulse processing for enhancing the qualities of each blind-via and reducing the average resistance and resistance variance of each blind-via. For example, the laser 22 of FIG. 3 can be a 60 W TEA $CO_2$ laser having a wavelength of about 9 $\mu$m to 11 $\mu$m, a pulse repetition frequency of about 150 Hz, and a pulse width of about 100 ns can be used in a scan mode operation for initially drilling 50 $\mu$m diameter blind-vias in a 50 $\mu$m thick dielectric layer. In this example, the TEA $CO_2$ laser is adjusted to apply 26 J/cm$^2$ per pulse so that the initial drilling is a 2 or 3 pulse operation per blind-via. After all blind-vias have been drilled by the TEA laser, the substrate is switched over to a suitable pulsed YAG laser for blind-via post-pulse processing for reducing the average resistance and the variance of the resistance of the vias, as described above.

Correcting Astigmatism

When a quadrupled Nd:YAG laser (wavelength equals 266 nm) is used for laser drilling, as described above, the entrance quality of the vias can be ensured by correcting for astigmatism in the laser beam. Referring again to FIG. 3, a plate 41 is interposed in the beam path between laser source 22. and substrate or workpiece 32. In particular, beam 22a passes through an aperture formed in plate 41. Plate 41 is positioned in the beam path at a point that is equal to or less than the Rayleigh range of the beam. The size of aperture 41 is selected to block the side lobes of beam 22a.

Fiducial Laser Drilling

When producing a laminated substrate, the laser drilling techniques of the present invention can be used for determining the fiducial registration of each conductive layer. At least two registration marks, such as circle shapes, are formed on core layer 2 shown in FIG. 1. As each layer is formed, laser drilling and post-pulse processing is used for drilling down to core layer 2 for exposing the registration marks so that the registration marks formed on core 2 can be used as fiducial registration points for aligning the next layer. The process of drilling each layer to expose the fiducial registration marks is done for all layers except for the final outer conductor layer, which is formed using known self-aligning techniques.

Forming Low Inductance Vias

Figure 8A:
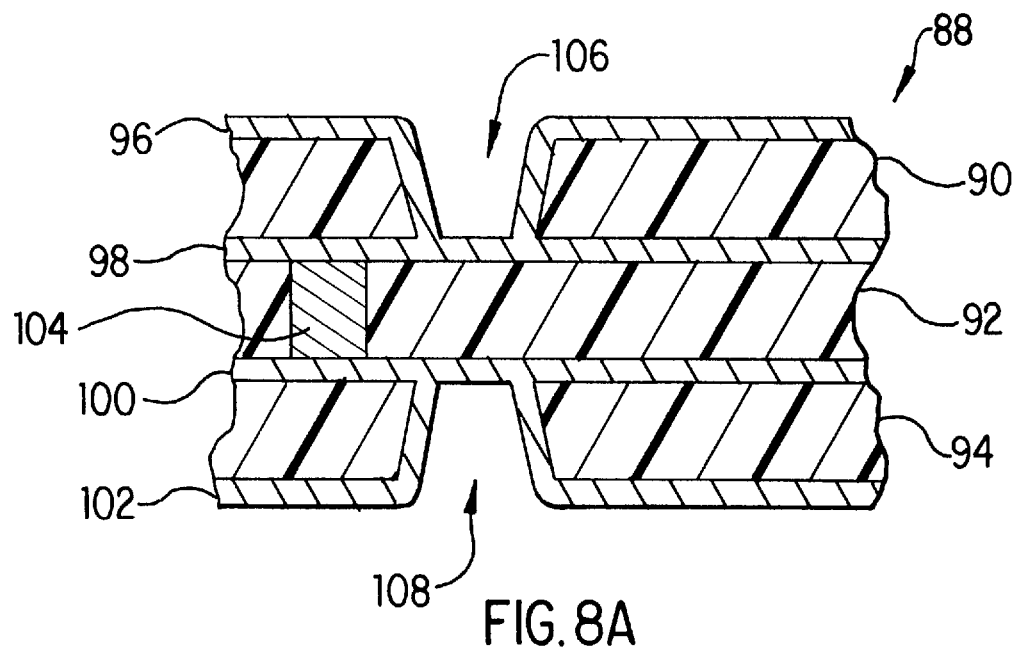
FIG. 8A is a sectional view of a multilayered substrate having a low impedance via pattern.

The present invention includes a method for making a low inductance conductive via. FIG. 8A shows a cross-sectional view of a multilayered substrate 88 having low inductance vias, based on a blind-buried-blind-via pattern. The substrate is formed by layering dielectric layers 90, 92, and 94 and conductive layers 96, 98, 100, and 102. These layers are made of the materials and by the processes described above. A buried via 104 provides an electrical interconnection between adjacent conductive layers 98 and 100, and was formed by the methods described above with respect to forming blind-vias, prior to being enclosed by subsequent layering.

Blind-vias 106 and 108 are formed opposite of each other and from opposite sides of the substrate 88. These are formed according to the methods described above, and correspond to blind-via 11 of FIG. 1 and blind-via 44 of FIGS. 5A and 5B.

Figure 8B:
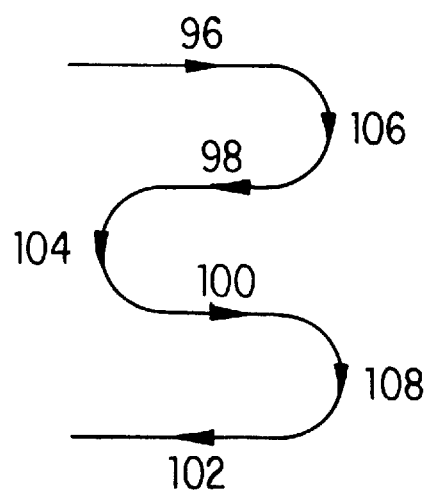
FIG. 8B is a schematic view of a current path which illustrates the mutual impedance cancellation resulting from the pattern of vias.

A signal path is schematically illustrated in FIG. 8B, showing flow from conductive layer 96, through-via 106 to layer 98, through layer 98, through buried-via 104 to layer 100, through layer 100, through blind-via 108 to layer 102, and through layer 102.

This signal path is arranged such that portions of the conductive layers are routed along parallel but vertically spaced paths, with the current or signal flowing in opposite directions. By arranging the signals in this manner, a mutual inductance formed by a first signal path segment with a second adjacent signal path segment cancels a mutual inductance formed by the second conductive path segment with the first conductive path segment. This is due to the fact that current flowing through the vias flows in one direction in the first signal path segment and flows in an opposite direction in an adjacent signal path segment. For example, a mutual inductance formed by the signal path 100 with the signal path 102 cancels a mutual inductance formed by signal path 102 with the signal path 100. Similarly, a mutual inductance formed by signal path 100 with signal path 98 cancels a mutual inductance formed by signal path 98 with signal path 100.

Figure 8C:
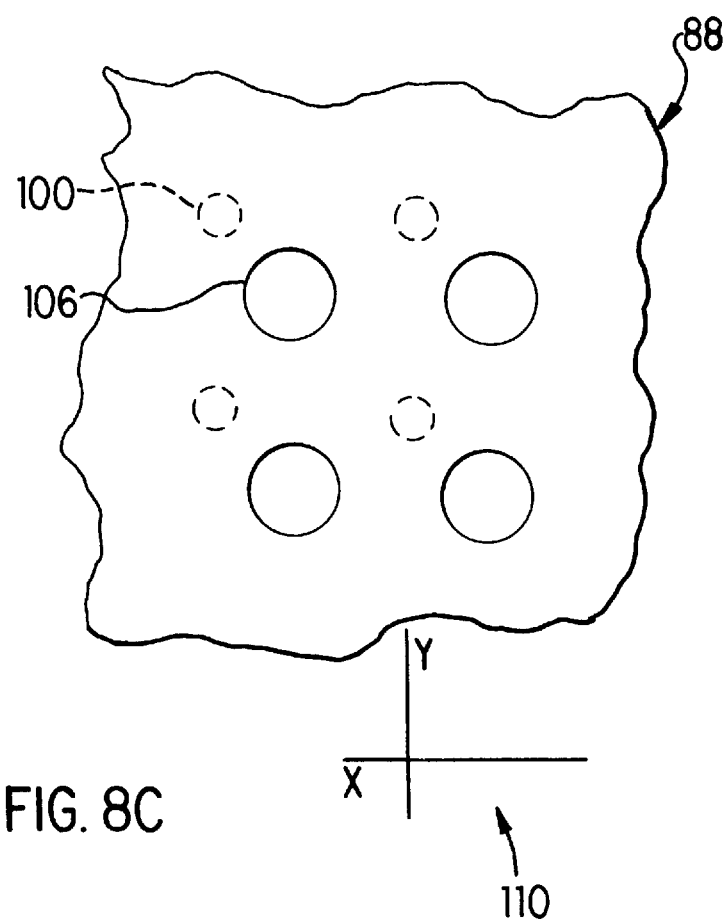
FIG. 8C is a partial top plan view of a multilayered substrate showing the pattern of vias that optimize density.

The physical arrangement of the blind-vias and buried-vias can be configured as shown in FIG. 8C for maximizing density of the vias 106 the interconnection circuit. FIG. 8B shows blind-vias 106 arranged in a row and column configuration that are parallel to axes of a Cartesian coordinate system 110, while buried vias 100 are arranged between the rows and columns so that the signal paths run at an angle with the axes of Cartesian coordinate system 110, that is, diagonally between the blind-vias and buried-vias. Preferably, the signal paths run at 45° from the axes of Cartesian coordinate system 110.

Fiducial Check

Figure 9:
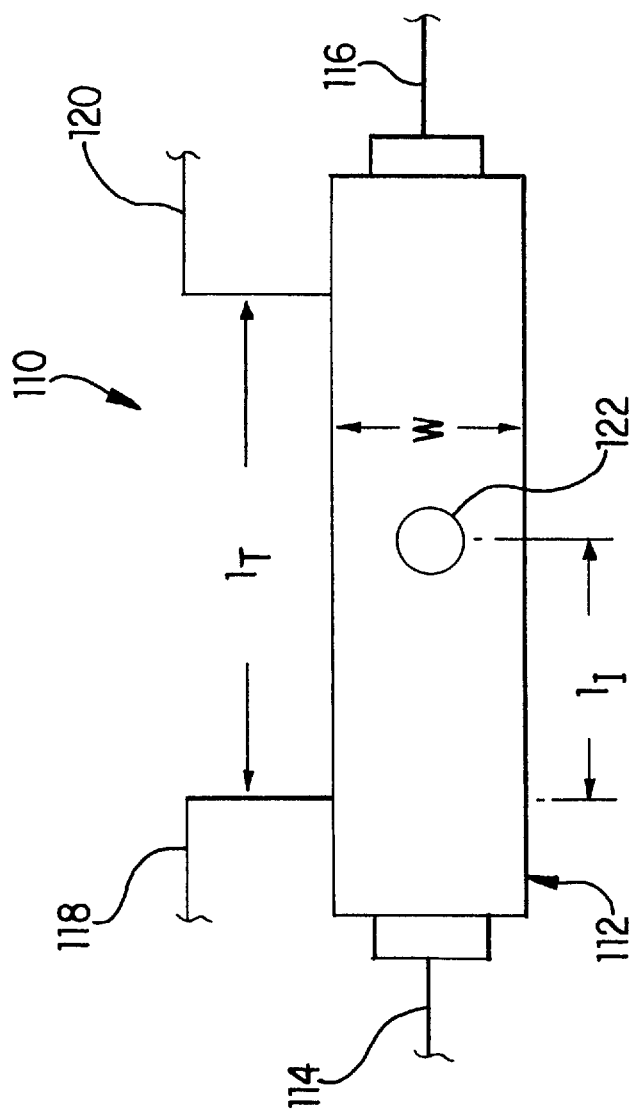
FIG. 9 is a top view of a kelvin resistor used as a fiducial check according to the present invention.

The present invention provides a way to check the fiducial registration of each conductive layer in a laminated structure. Referring to FIG. 9, a kelvin resistor 110 is produced by forming a resistive area 112 at the same location on each conductive layer of a multilayer substrate in a known manner using copper or nickel-plated gold, for example, as a resistive material. Leads 114 and 116 are connected to opposite ends of resistive area 112.

Leads 118 and 120 are connected to the resistive area 112 with a predetermined separation $1_T$. A resistive area 112 is formed at the same physical location on each conductive layer of the multilayer structure. Once all layers have been formed, a through-via 122 is drilled using the laser drilling techniques of the present invention. The through-via 122 is located a predetermined distance $1_1$ from the lead 114. The through-via 122 is plated so that all resistive areas 112 are electrically interconnected.

A known current is injected into resistive area 112 through the lead 114 and extracted from lead 116. Leads 118 and 120 are each positioned from leads 114 and 116 at a point where the current density across resistive area 112 is uniform and equal. The voltage between leads 114 and 116 is measured and the voltage between lead 114 and the through-via 122 is measured. The resistance between leads 114 and 116, and between lead 114 and the through-via 122 is determined based on the known current injected into lead 114 and the dimensions of the resistive area. The registration variation 8 of a conductive layer is determined by $$\delta = \left(\frac{R_1 - R_2}{R_T}\right) 1_T$$

where,

R₁ is the fractional resistance of resistive area 112 between lead 118 and through-via 122;

R₂ is the fractional resistance of resistive area 112 between through-via 122 and lead 120; and $1_T$ is the predetermined design distance separating leads 118 and 120.

The fractional resistance $R_1$ is determined by $$R_1 = R_s \frac{1_1}{W}$$

where, $R_s$ is the resistivity of the material used for resistive area 112, $1_1$ is the distance between lead 118 and through-via 122, and W is the width of resistive area 112.

The fractional resistance $R_2$ of resistive area 112 is determined by $$R_2 = R_s \frac{1_2}{W}$$

where, $1_2$ is the distance between through-via 112 and lead 120.

Flip-Chip Package

Figure 10:
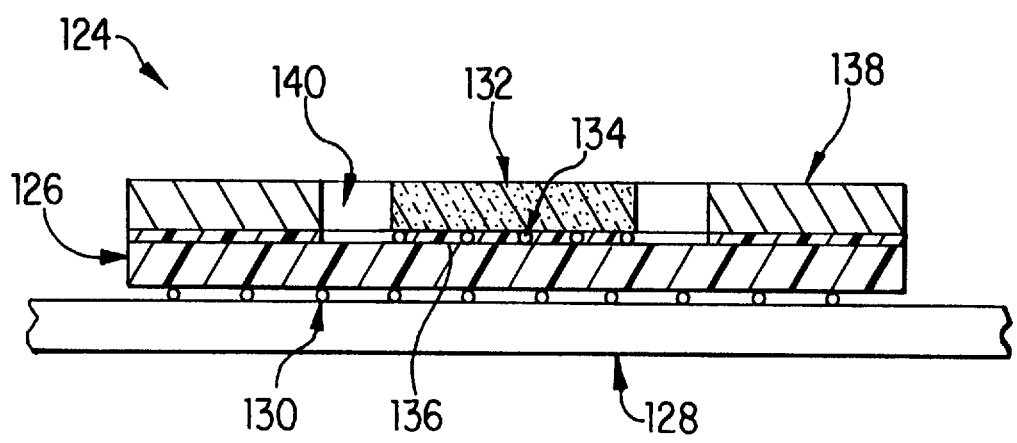
FIG. 10 shows a cross-sectional view of a flip-chip MCM package using a laminated substrate according to the invention as an interconnection circuit device.

One embodiment of a laminated substrate according to the present invention is used in fabricating a flip-chip single chip module (SCM) package. FIG. 10 illustrates a flip-chip type chip/package system 124 made according to the present invention. System 124 includes a laminated substrate as an interconnect device 126 which is mechanically and electrically attached to a printed wiring board (PWB) 128 through an array of solder ball connections 130. The array of solder ball connections 130 may be a full array or it may be depopulated in the area under the semiconductor device 132.

Semiconductor device 132 is mechanically and electrically attached to interconnect device 126 through an array, full or depopulated, of solder ball connections 134. In addition, an underfill adhesive 136 disposed between chip 132 and interconnect device 126 reinforces the chip/interconnect device connection. The adhesive is typically a filled epoxy that is dispensed and thermally cured in a well-known manner.

Interconnect device 126 is made of the alternating laminates of conductive layers and dielectric layers described above, and has a coefficient of thermal expansion (CTE) that nearly matches the CTE of PWB 128. Additionally, it is required that interconnect device 126 be flat and mechanically robust enough to be easily assembled. To accomplish this, a stiffener ring 138 is adhered to interconnect device 126. Stiffener ring 138 has a cavity 140 (or cavities) for the semiconductor device and any other devices, such as capacitors, that are attached on the same surface to interconnect device 126.

In the past, interconnect devices were made of ceramic materials. As the density of interconnection on semiconductor devices increases, the solder ball connections between the interconnect device and the PWB tend to fail due to CTE mismatch. The interconnect device of the present invention eliminates this failure mode by closely matching the CTE of the interconnect device to the PWB.

The relative thickness of interconnection circuit device 126 of between 5 mils to 20 mils, inclusive, causes the device to be adversely affected by the difference between the CTE of PWB 128 and CTE of the chip 132. Typically, the CTE of a flip-chip PWB varies between 17 to 25 ppm, while the CTE of an integrated circuit chip is 3 ppm. The CTE of interconnection circuit device 126 is selected so that the difference between the CTE $\alpha_1$ of chip 132 and the CTE $\alpha_2$ of interconnection circuit device 126 is 20 ppm or less. Preferably, the CTE of interconnection circuit device 126 is selected to be nominally 18 ppm for minimizing adverse affects caused by the difference between the respective CTEs of PWB 128 and chip 132. In the region where interconnection circuit device 126 is bonded to chip 132, the physical characteristics of chip 132 predominate and the effective CTE of interconnection circuit device 126 is about 12. In the region where interconnection circuit device 126 is bonded to support ring 138, the characteristics of support ring 138 predominate and the effective CTE of interconnection circuit device 126 matches the CTE of PWB 128.

The CTE of interconnection circuit device 126 is dominated by the dielectric substrate material forming the device. When interconnection circuit device 126 is attached to chip 132, both device 126 and chip 132 are heated during solder reflow to typically above 180° C. Depending upon the dielectric material used for interconnection circuit device 126, the dielectric material can be heated above the glass transition temperature $T_g$ of the dielectric material, causing the CTE of the dielectric material to change by as much as three times the initial CTE of the dielectric material. Consequently, the dielectric material is selected to preferably have a $T_g$ to be 200° C. or greater so that the CTE of interconnection circuit device 126 remains nominally 20 ppm/° C. during the temperature range of the solder reflow.

As noted above, interconnect circuit device 126 and chip 132 are additionally adhesively bonded together using an underfill, typically a filled epoxy, in a known manner. The epoxy underfill shrinks as it cures, thus reducing movement of the chip with respect to interconnection circuit device 126 so that electrical connections formed by solder balls 134 are less likely to fail. However, the cure shrinkage and bonding at elevated temperature of 150°–175° C. of the epoxy underfill also causes interconnect circuit device 126 and chip 132 to bend, thus separating interconnection circuit device 126 from chip 132 near the center of the bond between the parts and stressing the electrical connections formed by solder balls 134.

To avoid this condition, the integrated circuit chip 132 is selected to be 25 mils thick or greater. The flexural or bending modulus of a device increases proportionally to the thickness of the device cubed. Thus, by using an integrated circuit chip that is 25 mils thick or greater, chip 132 has less of a tendency to bend in response to a cure shrinkage force. As a result, the reliability of the packaged semiconductor is enhanced.

Dielectric

Any suitable dielectric material can be used in the present, such as, but not limited to, polyimides and polyimide laminates, epoxy resins, epoxy resins in combination with other resin material, organic materials, alone or any of the above combined with fillers. Preferred dielectric materials include a fluoropolymer matrix, where the fluoropolymer can be PTFE, ePTFE or copolymers or blends. Suitable fluoropolymers include, but are not limited to, polytetrafluoroethylene or expanded polytetrafluoroethylene, with or without an adhesive filler mixture.

Preferred materials include Speedboard® bond plies available from W. L. Gore and Associates, Inc., such as, Speedboard® C which is a prepreg of nonwoven material containing a cyanate ester resin in a polytetrafluoro-ethylene matrix. Speedboard® C has a dielectric constant, (Dk) of 2.6–2.7 at 1 MHz–10 GHz, a loss tangent of 0.004 at 1 MHz–10 GHz, a dielectric strength greater than 1000 V/mil, a glass transition ($T_g$) of 220° C., a resin content of 66–68 wt. % and is available in a variety of thicknesses. Also Speedboard® N prepreg, which is a prepreg of a non-woven material containing a multi-functional epoxy adhesive, in an expanded PTFE matrix may also be used. Speedboard® N has a dielectric constant, (Dk) of 3.0 at 1 MHz, a loss tangent of 0.02 at 1 MHz, a dielectric strength greater than 900 V/mil, a glass transition ($T_g$) of 140° C., a resin content of 66–68 wt. % and is available in a variety of thicknesses.

Figure 11:
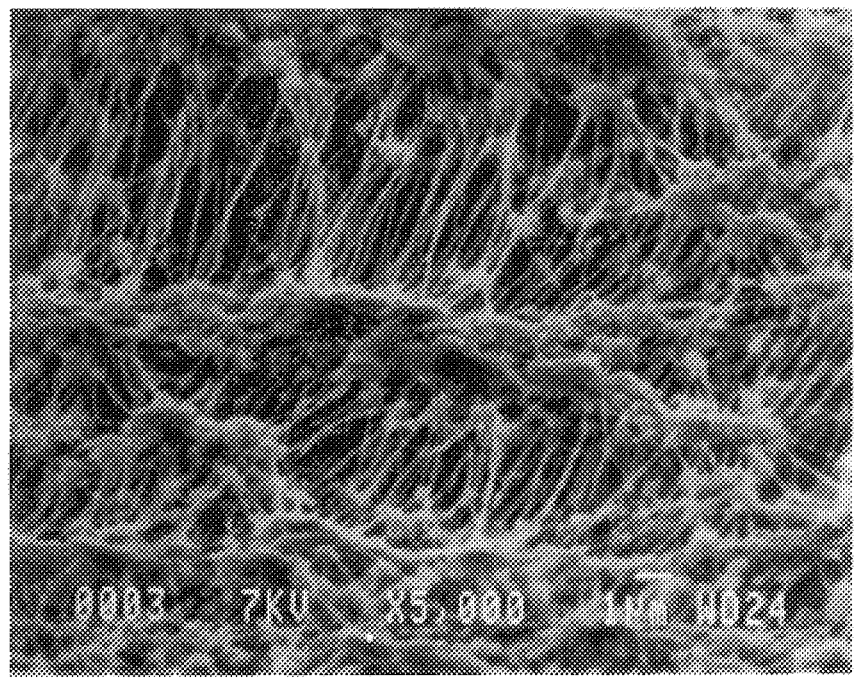
FIG. 11 is a scanning electron micrograph of a porous polymer used for a filler containing dielectric according to the present invention.

Another suitable dielectric is an expanded PTFE matrix, shown in FIG. 11, that includes a mixture of at least two of a cyanate ester compound, an epoxy compound, a bis-triazine compound and a poly (bis-maleimide) resin. For example, a varnish solution is made by mixing 5.95 pounds of M-30 (Ciba Geigy), 4.07 pounds of RSL 1462 (Shell Resins, Inc.), 4.57 pounds of 2, 4, 6-tribromophenyl-terminated tetrabromobisphenol A carbonate oligomer (BC-58) (Great Lakes Inc.), 136 g bisphenol A (Aldrich Company), 23.4 g Irganox 1010, 18.1 g of a 10% solution of Mn HEX-CEM in mineral spirits, and 8.40 kg MEK. The varnish solution was further diluted into two separate baths –20% (w/w) and 53.8% (w/w). The two varnish solutions were poured into separate impregnation baths, and an e-PTFE web was successively passed through each impregnation bath one immediately after the other. The varnish was constantly agitated so as to insure uniformity. The impregnated web was then immediately passed through a heated oven to remove all or nearly all the solvent and partially cure the adhesives, and was collected on a roll. The ePTFE web may be any desired thickness, such as 25 μm, 40 μm, for example. A 25 μm thick material has a mass of approximately 0.9 g and a weight per area of approximately 11.2 to 13.8 g/m$^2$ Other classes of dielectric materials include those where a porous matrix system contains an imbibed or impregnated adhesive-filler mixture. The porous matrix is a non-woven substrate that is imbibed with high quantities of filler and a thermoplastic or thermoset adhesive, as a result of the initial void volume of the substrate, heated to partially cure the adhesive and form a B-stage composite. Substrates include fluoropolymers, such as the porous expanded polytetrafluoroethylene material of U.S. Pat. Nos. 3,953,566 to Gore and 4,482,516 to Bowman, et al., each of which is incorporated herein by reference. Desirably, the mean flow pore size (MFPS) should be between about 2 to 5 times or above that of the largest particulate, with a MFPS of greater than about 2.4 times that of the filler being particularly preferred. However, it is also within the scope of the invention that suitable composites can be prepared by selecting the mean flow particle size MFPS to average particle size ratio to be greater than 1.4. Acceptable composites can also be prepared when the minimum pore size to average particle size is at least above 0.8 or the minimum pore size to the maximum particle size is at least above 0.4. The MFPS to particle size ratio ratios being performed with a microtrak FRA analyzer.

Alternatively, another mechanism for gauging relative pore and particle sizes may be calculated as the smallest pore size being not less than about 1.4 times the largest particle size.

In addition to expanded fluoropolymer substrates, porous expanded polyolefins, such as ultra high molecular weight (UHMW) polyethylene, expanded polypropylene, polytetrafluoroethylene made prepared by paste extrusion and incorporating sacrificial fillers, porous inorganic or organic foams, microporous cellulose acetate, can also be used.

The porous substrate has an initial void volume of at least 30%, preferably at least 50%, and most preferably at least 70%, and facilitates the impregnation of thermoset or thermoplastic adhesive resin and particulate filler paste in the voids while providing a flexible reinforcement to prevent brittleness of the overall composite and settling of the particles.

The filler comprises a collection of particles when analyzed by a Microtrak® Model FRA Partical Analyzer device, which displays a maximum particle size, a minimum particle size and an average particle size by way of a histogram.

Suitable fillers to be incorporated into the adhesive include, but are not limited to, $BaTiO_3$, $SiO_2$, $Al_2O_3$, ZnO, $ZrO_2$, $TiO_2$, precipitated and sol-gel ceramics, such as silica, titania and alumina, non-conductive carbon (carbon black) and mixtures thereof. Especially preferred fillers are $SiO_2$, $ZrO_2$, $TiO_2$ alone or incombination with non-conductive carbon. Most preferred fillers include filler made by the vapor metal combustion process taught in U.S. Pat. No. 4,705,762, such as, but not limited to silicon, titanium and aluminum to produced silica, titania, and alumina particles that are solid in nature, i.e., not a hollow sphere, with a uniform surface curvature and a high degree of sphericity.

The fillers may be treated by well-known techniques that render the filler hydrophobic by silylating agents and/or agents reactive to the adhesive matrix, such as by using coupling agents. Suitable coupling agents include, silanes, titanates, zirconates, and aluminates. Suitable silylating agents may include, but are not limited to, functional silyating agents, silazanes, silanols, siloxanes. Suitable silazanes, include, but are not limited to, hexamethyldisilazane (Huls H730) and hexamethylcyclotrisilazane, silylamides such as, bis(trimethylsilyl)acetamide (Huls B2500), silylureas such as trimethylsilylurea, and silylmidazoles such as trimethylsilylimidazole.

Titanate coupling agents are exemplified by the tetra alkyl type, monoalkoxy type, coordinate type, chelate type, quaternary salt type, neoalkoxy type, cycloheteroatom type. Preferred titanates include, tetra alkyl titanates, Tyzor® TOT {tetrakis(2-ethyl-hexyl) titanate, Tyzor® TPT {tetraisopropyl titanate}, chelated titanates, Tyzor® GBA {titanium acetylacetylacetonate}, Tyzor® DC {titanium ethylacetacetonate}, Tyzor® CLA {proprietary to DuPont}, Monoalkoxy (Ken-React® KR TTS), Ken-React®, KR-55 tetra (2,2 diallyloxymethyl)butyl, di(ditridecyl)phosphito titanate, LICA® 38 neopentyl(diallyl)oxy, tri(dioctyl)pyrophosphato titanate.

Suitable zirconates include, any of the zirconates detailed at page 22 in the Kenrich catalog, in particular KZ 55-tetra (2,2 diallyloxymethyl)butyl, di(ditridecyl)phosphito zirconate, NZ-01-neopentyl(diallyl)oxy, trineodecanoyl zirconate, NZ-09-neopentyl(diallyl)oxy, tri(dodecyl) benzene-sulfonyl zirconate.

The aluminates that can be used in the present invention include, but are not limited to Kenrich®, diisobutyl(oleyl) acetoacetylaluminate (KA 301), diisopropyl(oleyl) acetoacetyl aluminate (KA 322) and KA 489.

In addition to the above, certain polymers, such as, cross-linked vinylic polymers, e.g., divinylbenzene, divinyl pyridine or a sizing of any of the disclosed thermosetting matrix adhesives that are first applied at very high dilution (0.1 up to 1.0% solution in MEK) can be used. Also, certain organic peroxides, such as, dicumylperoxide can be reacted with the fillers.

The adhesive itself may be a thermoset or thermoplastic and can include polyglycidyl ether, polycyanurate, polyisocyanate, bis-triazine resins, poly (bis-maleimide), norbornene-terminated polyimide, polynorbornene, acetylene-terminated polyimide, polybutadiene and functionalized copolymers thereof, cyclic olefinic polycyclobutene, polysiloxanes, poly sisqualoxane, functionalized polyphenylene ether, polyacrylate, novolak polymers and copolymers, fluoropolymers and copolymers, melamine polymers and copolymers, poly(bis phenycyclobutane), and blends or prepolymers thereof. It should be understood that the aforementioned adhesives may themselves be blended together or blended with other polymers or additives, so as to impact flame retardancy or enhanced toughness.

As used herein, Mean Flow Pore Size and minimum pore size were determined using the Coulter® Porometer II (Coulter Electronics Ltd., Luton UK) which reports the value directly. Average particle size and largest particle size were determined using a Microtrac light scattering particle size analyzer Model No. FRA (Microtrac Division of Leeds & Northup, North Wales, Pa., USA). The average particle size (APS) is defined as the value at which 50% of the particles are larger. The largest particle size (LPS) is defined as the largest detectable particle on a Microtrac histogram. Alternatively, the largest particle size is defined at the minimum point when the Microtrak FRA determines that 100% of the particulate have passed.

In general, the method for preparing the adhesive-filler delectirc involves: (a) expanding a polytetrafluoroethylene particulate, with a MFPS of greater than about 2.4 times that of the filler being particularly preferred. However, it is also within the scope of the invention that suitable composites can be prepared by selecting the mean flow particle size MFPS to average particle size ratio to be greater than 1.4. Acceptable composites can also be prepared when the minimum pore size to average particle size is at least above 0.8 or the minimum pore size to the maximum particle size is at least above 0.4. The MFPS to particle size ratio ratios being performed with a microtrak FRA analyzer.

Alternatively, another mechanism for gauging relative pore and particle sizes may be calculated as the smallest pore size being not less than about 1.4 times the largest particle size.

Table 17 shows the effect of the relationship of the substrate mean flow pore size (MFPS) and particulate size. When the ratio of the mean flow pore size (MFPS) to largest particulate is 1.4 or less, poor results are observed. In this case, a homogeneous composite is not observed, and most of the particulate filler does not uniformly penetrate the microporous substrate. When the ratio of the MFPS to largest particulate is greater than about 2.0, then a uniform composite is obtained. It is also observed that the larger the ratio of MFPS to largest particulate, the greater the relative case it is to imbibe a homogeneous dispersion into the microporous substrate.

TABLE 17

| Sample | Substrate Pore Size | | Particle Size | | MFPS ÷ $Part_{Avg}$ | $Pore_{Min}$ ÷ $Part_{Max}$ | $Pore_{Min}$ ÷ $Part_{Avg}$ | Result |
|---|---|---|---|---|---|---|---|---|
| | Min (μm) | MFPS (μm) | Avg (μm) | Max (μm) | | | | |
| A | 4 | 7 | 5 | 10 | 1.4 | 0.4 | 0.8 | Poor |
| B | 4 | 5 | 5 | 10 | 1.0 | 0.4 | 0.8 | Poor |
| C | — | 58 | 5 | 10 | 12.4 | N/A | — | Good |
| D | 18 | 32 | 6 | 10 | 5.3 | 1.8 | 3.0 | Good |
| E | 18 | 32 | 1 | 1 | 32.0 | 18.0 | 18 | Good |
| F | 17 | 24 | 6 | 10 | 4.0 | 1.7 | 2.8 | Good |
| G | 0.2 | 0.4 | 0.5 | 1.6 | 0.8 | 0.125 | 0.4 | Poor |
| H | — | 60 | 18 | 30 | 3.3 | — | — | Good |
| I | 14 | 11 | 0.5 | 1.6 | 22.0 | 8.8 | 28 | Good |
| J | 14 | 29 | 4 | 8 | 7.3 | 1.8 | 3.5 | Good |
| K | 14 | 29 | 5 | 10 | 5.8 | 1.4 | 2.8 | Good | sheet by stretching a lubricated extruded perform to a microstructure sufficient to allow small particles and adhesives to free flow into the void or pore volume; (b) forming a paste from polymeric, e.g., thermoset or thermoplastic material and a filler; and (c) imbibing by dipping, coating, pressure feeding, the adhesive-filler paste into the highly porous scaffold, such as expanded polytetrafluoroethylene.

To prepare the filled adhesive film of this invention, particulate filler is mixed into a solvent or aqueous solution or molten adhesive to afford a finely dispersed mixture. The filler in small particle form is ordinarily less than 40 microns in size, and preferably has an average particulate size between 1 and 10 microns. The mean pore size of the node-and-fibril structure of the polytetrafluoroethylene should be large enough to allow for adequate penetration of the particulate. If the substrate is to be expanded polytetrafluoroethylene, then structures similar to those taught in U.S. Pat. No. 4,482,516 to Bowman, et al. are desirable. Desirably, the mean flow pore size (MFPS) should be between about 2 to 5 times or above that of the largest

EXAMPLE 1

A fine dispersion was prepared by mixing 281.6 g $TiO_2$ (TI Pure R-900, Du Pont Company) into a 20% (w/w) solution of a flame retarded dicyanamide/2-methylimidazole catalyzed bisphenol-A based polyglycidyl ether (Nelco N-4002-5, Nelco Corp.) in MEK. The dispersion was constantly agitated so as to insure uniformity. A swatch of expanded PTFE was then dipped into the resin mixture. The web was dried at 165° C. for 1 min. under tension to afford a flexible composite. The partially-cured adhesive composite thus produced comprised of 57 weight percent $TiO_2$, 13 weight percent PTFE and 30 weight percent epoxy adhesive. Several plies of the adhesive sheet were laid up between copper foil and pressed at 600 psi in a vacuum-assisted hydraulic press at temperature of 225° C. for 90 min. then cooled under pressure. This resulted in a copper laminate having dielectric constant of 19.0, and withstood a 30 sec. solder shock at 280° C. at an average ply thickness of 100 mm (0.0039"(3.9 mil)) dielectric laminate thickness.

EXAMPLE 2

A fine dispersion was prepared by mixing 386 g $SiO_2$ (HW-11-89, Harbison Walker Corp.) which was pretreated with phenyltrimethoxysilane (04330, Huls/Petrarch) into a manganese catalyzed solution of 200 g bismaleimide triazine resin (BT206OBJ, Mitsubishi Gas Chemical) and 388 g MEK. The dispersion was constantly agitated so as to insure uniformity. A swatch of 0.0002" thick expanded PTFE was then dipped into the resin mixture, removed, and then dried at 165° C. for 1 min. under tension to afford a flexible composite. Several plies of this prepreg were laid up between copper foil and pressed at 250 psi in a vacuum-assisted hydraulic press at temperature of 225° C. for 90 min. then cooled under pressure. This resulting dielectric thus produced comprised of 53 weight percent $SiO_2$, 5 weight percent PTFE and 42 weight percent adhesive, displayed good adhesion to copper, dielectric constant (at 10 GHz) of 3.3 and dissipation factor (at 10 GHz) of 0.005.

EXAMPLE 3

A fine dispersion was prepared by mixing 483 g $SiO_2$ (HW-11-89) into a manganese-catalyzed solution of 274.7 g bismaleimide triazine resin (BT206OBJ, Mitsubishi Gas Chemical) and 485 g MEK. The dispersion was constantly agitated so as to insure uniformity. A swatch of 0.0002" thick expanded PTFE was then dipped into the resin mixture, removed, and then dried at 165° C. for 1 min. under tension to afford a flexible composite. Several plies of this prepreg were laid up between copper foil and pressed at 250 psi in a vacuum-assisted hydraulic press at temperature of 225° C. for 90 minutes then cooled under pressure. The resulting dielectric thus produced comprised of 57 weight percent $SiO_2$, 4 weight percent PTFE and 39 weight percent adhesive, displayed good adhesion to copper, dielectric constant (at 10 GHz) of 3.2 and dissipation factor (at 10 GHz) of 0.005.

EXAMPLE 4

A fine dispersion was prepared by mixing 15.44 kg $TiO_2$ powder (TI Pure R-900, DuPont Company) into a manganese-catalyzed solution of 3.30 kg bismaleimide triazine resin (BT206OBH, Mitsubishi Gas Chemical) and 15.38 kg MEK. The dispersion was constantly agitated so as to insure uniformity. A swatch of 0.0004" $TiO_2$-filled expanded PTFE (filled according to the teachings of Mortimer U.S. Pat. No. 4,985,296, except to 40% loading of $TiO_2$ and the membrane was not compressed at the end) was then dipped into the resin mixture, removed, and then dried at 165° C. for 1 min. under tension to afford a flexible composite. The partially cured adhesive composite thus produced comprised of 70 weight percent $TiO_2$, 9 weight percent PTFE and 21 weight percent adhesive. Several plies of this prepreg were laid up between copper foil and pressed at 500 psi in a vacuum-assisted hydraulic press at temperature of 220° C. for 90 minutes then cooled under pressure. This resulting dielectric displayed good adhesion to copper, dielectric constant of 10.0 and dissipation factor of 0.008.

EXAMPLE 5

A fine dispersion was prepared by mixing 7.35 kg $SiO_2$ (ADMATECHS SO-E2, Tatsumori LTD) with 7.35 kg MEK and 73.5 g of coupling agent, i.e.,3-glycidyloxypropyltrimethoxysilane (Dynasylan GLYMO (Petrach Systems). SO-E2 is described by the manufacture as having highly spherical silica having a particle diameter of 0.4 to 0.6 mm, a specific surface area of 4–8 $m^2$g, a bulk density of 0.2–0.4 g/cc (loose).

To this dispersion was added 932 g of a 50% (w/w) solution of a cyanated phenolic resin, Primaset PT-30 (Lonza Corp.). In (MEK) methylethylketone, 896 g of a 50% (w/w) solution of RSL 1462 (Shell Resins, Inc.(CAS #25068-38-6)) in MEK, 380 g of a 50% (w/w) solution of BC-58 (Great Lakes, Inc.) in MEK, 54 g of 50% solution of bisphenol A (Aldrich Company) in MEK, 12.6 g Irganox 1010 (Ciba Geigy), 3.1 g of a 0.6% solution of Manganese 2-ethylhexanoate (Mn HEX-CEM (OMG Ltd.), and 2.40 kg MEK. This dispersion was subjected to ultrasonic agitation through a Misonics continuous flow cell for about 20 minutes at a rate of about 1–3 gal./minute. The fine dispersion thus obtained was further diluted to an overall bath concentration of 11.9% solids (w/w).

Figure 12:
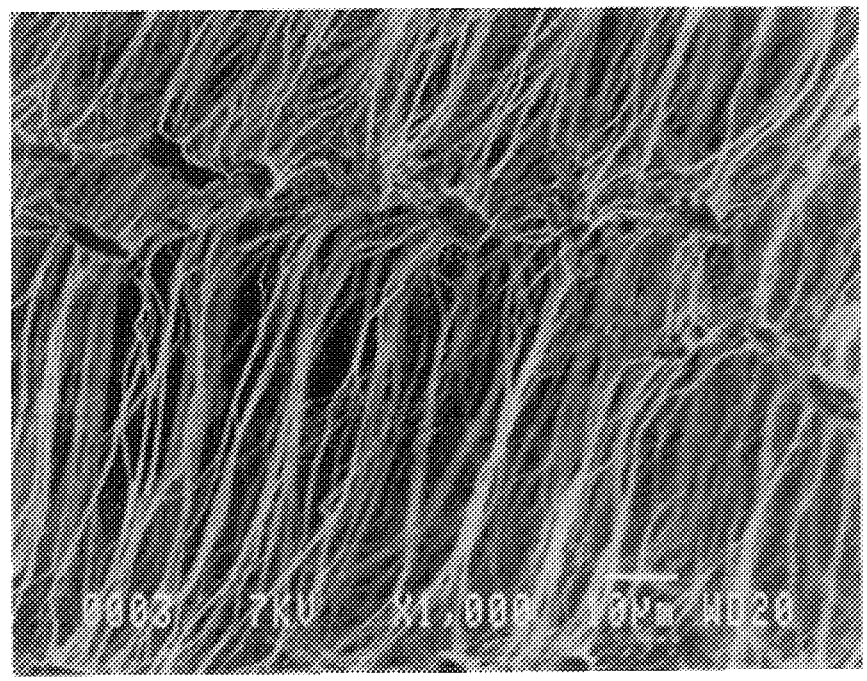
FIG. 12 is a schematic of a porous polymer containing an adhesive filler according to the present invention.

The fine dispersion was poured into an impregnation bath. A expanded polytetrafluoroethylene web having the node fibril structure of FIG. 12, and the following properties:

| | |
|---|---|
| Frazier | 20.55 |
| Coverage | 9 g/$m^2$ |
| Ball Burst | 3.2 lbs. |
| Thickness | 6.5 mil. |
| Mean Flow Pore Size | 9.0 microns |

The Frazier number relates to the air permeability of the material being assayed. Air permeability is measured by clamping the web in a gasketed fixture which is provided in circular area of approximately 6 square inches for air flow measurement. The upstream side was connected to a flow meter in line with a source of dry compressed air. The downstream side of the sample fixture was open to the atmosphere. Testing is accomplished by applying a pressure of 0.5 inches of water to the upstream side of the sample and recording the flow rate of the air passing through the in-line flowmeter (a ball-float rotameter that was connected to a flow meter.

The Ball Burst Strength is a test that measures the relative strength of samples by determining the maximum at break. The web is challenged with a 1 inch diameter ball while being clamped between two plates. The Chatillon, Force Gauge Ball/Burst Test was used. The media is plaaced taut in the measuring device and pressure afixed by raising the web into contact with the ball of the burst probe. Pressure at break is recorded.

The web described above was passed through a constantly agitated impregnation bath at a speed at or about 3 ft./min, so as to insure uniformity. The impregnated web is immediately passed through a heated oven to remove all or nearly all the solvent, and is collected on a roll.

Several plies of this prepeg were laid up between copper foil and pressed at 200 psi in a vacuum-assisted hydraulic press at temperature of 220° C. for 90 minutes and then cooled under pressure. This resulting dielectric displayed good adhesion to copper, dielectric constant (10 GHz) of 3.0 and dissipation factor of 0.0085 (10 GHz).

The physical properties of the particulate filler used in Example 4 and Example 7 are compared below.

| Property | Tatsumori (ADMATECHS) | Harbison Walker |
|---|---|---|
| Manufacture Technique | Vapor Metal Combustion | Amorphous Fused Silica |
| Designation | Silica SO-E2 | HW-11-89 |
| Median Particle Size | 0.5 micron | 5 micron |

-continued

| Property | Tatsumori (ADMATECHS) | Harbison Walker |
|---|---|---|
| Shape | Spherical | Irregular, jagged |
| Surface Area | 6–10 m$^2$/g | 10 m$^2$/g |
| Bulk Density | 0.47 g/cc | 1.12 g/cc |
| Specific Density | 2.26 g/cc | 2.16 g/cc |

EXAMPLE 6

An ePTFE matrix containing an impregnated adhesive filler mixture, based on SiO$_2$ prepared from the vapor combustion of molten silicon is prepared as follows. Two precursor mixtures were initially prepared. One being in the form of a slurry containing a silane treated silica similar to that of Example 5 and the other an uncatalyzed blend of the resin and other components.

Mixture I

The silica slurry is a 50/50 blend of the SO-E2 silica of Example 5 in MEK, where the silica contains a coated of silane which is equal to 1% of the silica weight. To a five gallon container, 17.5 pounds of MEK and 79 grams of silane were added and the two components mixed to ensure uniform dispersion of the silane in the MEK. Then, 17.5 pounds of the silica of Example 5 were added. Two five gallon containers of the MEK-silica-silane mixture were added to a reaction vessel, and the contents, i.e., the slurry, was recirculated through an ultrasonic disperser for approximately one hour to break up any silica agglomerates that may be present. The sonication was completed and the contents of the reaction vessel were heated to approximately 80° C. for approximately one hour, while the contents were continuously mixed. The reacted mixture was then transferred into a ten gallon container.

Mixture II

The desired resin blend product is an MEK based mixture containing an uncatalyzed resin blend (the adhesive) contains approximately 60% solids, where the solid portion is an exact mixture of 41.2% PT-30 cyanated phenolic resin, 39.5% RSL 1462 epoxy resin, 16.7% BC58 flame retardant, 1.5% Irganox 1010 stabilizer, and 1% bisphenol A co-catalyst, all percentages by weight.

Into a ten gallon container, 14.8 pounds of PT-30 and 15–20 pounds of MEK were added and stirred vigorously to completely solvate the PT-30. Then 6 pounds of BC58 were measured and added to the MEK/PT-30 solution and vigorously agitated to solvate the BC58. The stabilizer, 244.5 grams of Irganox 1010 and bisphenol A, 163 grams were added. The ten gallon container was reweighed and 14.22 pounds of RSL 1462 were added. Additional MEK was added to bring the mixture weight to 60 pounds. The contents were then vigorously agitated for approximately 1 to 2 hours, or as long is necessary to completely dissolve the solid components.

The desired product is a mixture of the silica treated with a silane, the uncatalyzed resin blend, and MEK in which 68% by weight of the solids are silica, and the total solids are between 5% and 50% by weight of the mixture. The exact solids concentration varies from run to run, and depends in part on the membrane to be impregnated. The catalyst level is 10 ppm relative to the sum of the PT-30 and RSL1462.

The solid contents of mixtures I and II were determined to verify the accuracy of the precursors and compensate for any solvent flash that had occurred. Then mixture I was added to a ten gallon container to provide 12 pounds of solids, e.g., 515 solids content, 23.48 pounds of mixture I. Then mixture II was added to the container to provide 5.64 pounds of solids, e.g., 59.6% solids, 9.46 pounds of mixture II. the manganese catalyst solution (0.6% in mineral spirits), 3.45 grams, was added to the mixture of mixture I and mixture II and blended thoroughly to form a high solids content mixture.

The bath mixture for impregnating an ePTFE matrix, 28% solids mixture, was prepared by adding sufficient MEK to the high solids content mixture to a total weight of 63 pounds.

Thereafter, an ePTFE matrix weas impregnated with this bath mixture to form a dielectric material.

EXAMPLE 7

A fine dispersion was prepared by mixing 26.8 grams Furnace Black (Special Schwarz 100, Degussa Corp., Ridgefield Park, N.J.) and 79 grams of coupling agent (Dynaslan GLYMO CAS #2530-83-8; 3-glycidyloxypropyl-trimethoxysilane (Petrach Systems). The dispersion was subjected to ultrasonic agitation for 1 minute, then added to a stirring dispersion of 17.5 pounds SiO$_2$ (SO-E2) in 17.5 pounds MEK which had previously been ultrasonically agitated. The final dispersion was heated with constant overhead mixing for 1 hour at reflux, then allowed to cool to room temperature.

Separately, an adhesive varnish was prepared by adding the following: 3413 grams of a 57.5% (w/w) mixture of Primaset PT-30 in MEK, 2456 grams of a 76.8% (w/w) mixture of RSL 1462 in MEK, 1495 grams of a 53.2% (w/w) solution of BC58 (Great Lakes, Inc.) in MEK, 200 grams of 23.9% (w/w) solution of bisphenol A (Aldrich Company) in MEK, 71.5 grams Irganox 1010, 3.21 grams of a 0.6% (w/w) solution of Mu HEX-CEM (OMG Ltd.) in mineral spirits, and 2.40 kg MEK.

In a separate container, 3739 grams of the dispersion described above was added, along with 0.0233 grams of Furnace Black (Special Schwarz 100, Degussa Corp., Ridgefield Park, N.J.), 1328 of the adhesive varnish described above and 38.3 pounds MEK. This mixture was poured into an impregnation bath, and an ePTFE web was passed through the impregnation bath at a speed at or about 3 ft/min. This dispersion was constantly agitated so as to insure uniformity. The impregnated web is immediately passed through a heated oven to remove all or nearly all the solvent, and is collected on a roll.

Several piles of this prepeg were laid up between copper foil and pressed at 200 psi in a vacuum-assisted hydraulic press at temperatures of 200° C. for 90 minutes then cooled under pressure. This resulting dielectric displayed good adhesion to copper.

EXAMPLE 8

An adhesive varnish was prepared by adding the following: 3413 grams of a 57.5% (w/w) solution of Primaset PT-30 (PMN P-88-1591)) in MEK, 2456 grams of a 76.8% (w/w) solution of RSL 1462 in MEK, 1495 grams of a 53.2% (w/w) solution of BC58 (Great Lakes, Inc.) in MEK, 200 grams of 23.9% (w/w) solution of bisphenol A (Aldrich Company) in MEK, 71.5 grams Irganox 1010, 3.21 grams of a 0.6% (w/w) solution of Mn HEX-CEM in mineral spirits, and 2.40 kg MEK.

In a separate container, 1328 grams of the adhesive varnish described above, 42.3 pounds MEK, 6.40 grams of Furnace Black (Special Schwarz 100, Degussa Corp., Ridgefield, N.J.) and 1860.9 grams SiO$_2$ (SO-E2). This mixture was poured into an impregnation bath, and an ePTFE web was passed through the impregnation bath at a speed at or about 3 ft/min. The dispersion was constantly agitated so as to insure uniformity. The impregnated web is immediately passed through a heated oven to remove all or nearly all the solvent, and is collected on a roll.

Several piles of this prepeg were laid up between copper foil and pressed at 200 psi in a vacuum-assisted hydraulic press at temperature of 220° C. for 90 minutes then cooled under pressure. This resulting dielectric displayed good adhesion to copper.

While the present invention has been described in connection with the illustrated embodiments, it will be appreciated and understood that modifications may be made without departing from the true spirit and scope of the invention.

What is claimed is:

1. A method of forming a via in a laminated substrate, comprising the steps of:

placing a first mask between an output optics of a laser and an exposed surface of a laminated substrate, the first mask having a first aperture corresponding to a location of a via in the substrate;

placing a second mask between the first mask and the output optics of the laser, the second mask having a second aperture disposed within a main beam of a laser beam output from the laser, the second aperture blocking side lobes of the laser beam from reaching the exposed surface of the substrate; and laser drilling the via in the substrate.

2. The method according to claim 1, wherein the laser emits at a wavelength of 266 nm, and wherein the second mask is placed at a distance from the output optics of the laser that is equal to or less than a Rayleigh range of the laser beam output from the laser.

3. The method according to claim 2, further comprising the steps of:

applying a polymeric photo-absorptive layer on the exposed surface of the substrate;

forming ablated material by laser drilling the via in the substrate through the photo-absorptive layer;

redepositing the ablated material on the photo-absorptive layer surrounding the via; and enhancing an entrance of the via by removing the photo-absorptive layer and the ablated redeposited material on the photo-absorptive layer.

4. The method according to claim 3, wherein the laminated substrate includes a dielectric material and a conductive material, the conductive material having the exposed surface of the substrate, and wherein the step of applying the photo-absorptive layer includes the step of applying the photo-absorptive layer on the exposed surface of the conductive layer.

5. The method according to claim 4, wherein the photo-absorptive layer is between 5 $\mu$m and 50 $\mu$m thick inclusive.

6. The method according to claim 5, wherein the photo-absorptive layer is nominally 25 $\mu$m thick.

7. The method according to claim 4, wherein an entrance width of the via is $\leq$25 $\mu$m.

8. The method according to claim 7, wherein an aspect ratio of the via is $\geq$3:1.

9. The method according to claim 8, wherein the step of forming the via in the substrate by laser drilling includes the step of applying a plurality of laser pulses to the substrate.

10. The method according to claim 9, wherein the step of applying a plurality of laser pulses includes the step of trepanning the laser pulses in a pattern for forming the via.

11. The method according to claim 10, wherein the pattern is circular.

12. The method according to claim 9, wherein the step of forming the via in the substrate by laser drilling includes the step of applying an energy density per pulse to the substrate that is greater than an ablation energy density threshold of the conductive layer.

13. The method according to claim 12, wherein the energy density per pulse applied to the substrate is greater than about 1.5 J/cm$^2$.

14. The method according to claim 13, wherein the energy density per pulse applied to the substrate is nominally 5 J/cm$^2$.

15. The method according to claim 14, wherein each pulse has a pulse width $\leq$100 ns.

16. The method according to claim 12, wherein the via is a through-via.

17. The method according to claim 7, wherein an aspect ratio of the via is >1:1.

18. The method according to claim 17, wherein the step of forming the via in the substrate by laser drilling includes the step of applying a plurality of laser pulses to the substrate.

19. The method according to claim 18, wherein the conductive layer has an aperture at a location corresponding to a location of the via in the substrate, the aperture exposing a surface of the dielectric layer, and wherein the step of forming the via in the substrate by laser drilling includes the step of applying an energy density per pulse to the substrate layer that is greater than an ablation energy density threshold of the dielectric layer and less than an ablation energy density threshold of the conductive layer.

20. The method according to claim 19, wherein the energy density per pulse applied to the dielectric layer is between 0.5 J/cm$^2$ and 3 J/cm$^2$ inclusive.

21. The method according to claim 20, wherein the energy density per pulse applied to the dielectric layer is nominally 2 J/cm$^2$.

22. The method according to claim 21, wherein each pulse has a pulse width $\leq$100 ns.

23. The method according to claim 20, wherein the via is a blind-via.

24. The method according to claim 7, wherein the step of forming the via in the substrate includes the steps of:

forming at least one blind-via in the substrate; and forming at least one through-via in the substrate.

25. The method according to claim 24, wherein the conductive layer has an aperture at a location corresponding to a location of each blind-via in the substrate, each aperture exposing a surface of the dielectric layer, and wherein the step of forming each blind-via in the substrate by laser drilling includes the step of applying an energy density per pulse to the substrate layer that is greater than an ablation energy density threshold of the dielectric layer and less than an ablation energy density threshold of the conductive layer.

26. The method according to claim 25, wherein an aspect ratio of at least one blind-via is $\geq$1:1, and an aspect ratio of at least one through-via is $\geq$3:1.

27. The method according to claim 26, wherein the step of forming each through-via in the substrate by laser drilling includes the step of applying a plurality of laser pulses to the substrate.

28. The method according to claim 27, wherein each pulse has a pulse width of about 100 ns or less.

29. The method according to claim 27, wherein the step of forming each through-via in the substrate by laser drilling includes the step of applying an energy density per pulse to the substrate that is greater than an ablation energy density threshold of the conductive layer.

30. The method according to claim 29, wherein the energy density per pulse applied to the substrate for drilling each through-via is greater than about 1.5 J/cm$^2$; and wherein the energy density per pulse applied to the dielectric layer for drilling each blind-via is between about 0.5 J/cm$^2$ and 3 J/cm$^2$ inclusive.

31. The method according to claim 30, wherein the energy density per pulse applied to the substrate for drilling each through-via is nominally 5 J/cm$^2$.

32. A laminated substrate having a via, the laminated substrate being formed by a method comprising the steps of:

placing a first mask between an output optics of a laser and an exposed surface of the substrate, the first mask having a first aperture corresponding to a location of a via in the substrate;

placing a second mask between the first mask and the output optics of the laser, the second mask having a second aperture disposed within a main beam of a laser beam output from the laser, the second aperture blocking side lobes of the laser beam from reaching the exposed surface of the substrate; and laser drilling the via in the substrate.

33. The laminated substrate according to claim 32, wherein the laser emits at a wavelength of 266 nm, and wherein the second mask is placed at a distance from the output optics of the laser that is equal to or less than a Rayleigh range of the laser beam output from the laser.

34. The laminated substrate according to claim 33, further comprising the steps of:

applying a polymeric photo-absorptive layer on the exposed surface of the substrate;

forming ablated material by laser drilling the via in the substrate through the photo-absorptive layer;

redepositing the ablated material on the photo-absorptive layer surrounding the via; and enhancing an entrance of the via by removing the photo-absorptive layer and the ablated redeposited material on the photo-absorptive layer.

35. The laminated substrate according to claim 34, wherein the laminated substrate includes a dielectric material and a conductive material, the conductive material having the exposed surface of the substrate, and wherein the step of applying the photo-absorptive layer includes the step of applying the photo-absorptive layer on the exposed surface of the conductive layer.

36. The laminated substrate according to claim 35, wherein the photo-absorptive layer is between 5 µm and 50 µm thick inclusive.

37. The laminated substrate according to claim 36, wherein the photo-absorptive layer is nominally 25 µm thick.

38. The laminated substrate according to claim 35, wherein an entrance width of the via is ≦25 µm.

39. The laminated substrate according to claim 38, wherein an aspect ratio of the via is ≧3:1.

40. The laminated substrate according to claim 39, wherein the step of forming the via in the substrate by laser drilling includes the step of applying a plurality of laser pulses to the substrate.

41. The laminated substrate according to claim 40, wherein the step of applying a plurality of laser pulses includes the step of trepanning the laser pulses in a pattern for forming the via.

42. The laminated substrate according to claim 41, wherein the pattern is circular.

43. The laminated substrate according to claim 40, wherein the step of forming the via in the substrate by laser drilling includes the step of applying an energy density per pulse to the substrate that is greater than an ablation energy density threshold of the conductive layer.

44. The laminated substrate according to claim 43, wherein the energy density per pulse applied to the substrate is greater than about 1.5 J/cm$^2$.

45. The laminated substrate according to claim 44, wherein the energy density per pulse applied to the substrate is nominally 5 J/cm$^2$.

46. The laminated substrate according to claim 45, wherein each pulse has a pulse width ≦100 ns.

47. The laminated substrate according to claim 43, wherein the via is a through-via.

48. The laminated substrate according to claim 38, wherein an aspect ratio of the via is ≧1:1.

49. The laminated substrate according to claim 48, wherein the step of forming the via in the substrate by laser drilling includes the step of applying a plurality of laser pulses to the substrate.

50. The laminated substrate according to claim 49, wherein the conductive layer has an aperture at a location corresponding to a location of the via in the substrate, the aperture exposing a surface of the dielectric layer, and wherein the step of forming the via in the substrate by laser drilling includes the step of applying an energy density per pulse to the substrate layer that is greater than an ablation energy density threshold of the dielectric layer and less than an ablation energy density threshold of the conductive layer.

51. The laminated substrate according to claim 50, wherein the energy density per pulse applied to the dielectric layer is between 0.5 J/cm$^2$ and 3 J/cm$^2$ inclusive.

52. The laminated substrate according to claim 51, wherein the energy density per pulse applied to the dielectric layer is nominally 2 J/cm$^2$.

53. The laminated substrate according to claim 52, wherein each pulse has a pulse width ≦100 ns.

54. The laminated substrate according to claim 51, wherein the via is a blind-via.

55. The laminated substrate according to claim 38, wherein the step of forming the via in the substrate includes the steps of:

forming at least one blind-via in the substrate; and forming at least one through-via in the substrate.

56. The laminated substrate according to claim 55, wherein the conductive layer has an aperture at a location corresponding to a location of each blind-via in the substrate, each aperture exposing a surface of the dielectric layer, and wherein the step of forming each blind-via in the substrate by laser drilling includes the step of applying an energy density per pulse to the substrate layer that is greater than an ablation energy density threshold of the dielectric layer and less than an ablation energy density threshold of the conductive layer.

57. The laminated substrate according to claim 56, wherein an aspect ratio of at least one blind-via is ≧1:1, and an aspect ratio of at least one through-via is ≧3:1.

58. The laminated substrate according to claim 57, wherein the step of forming each through-via in the substrate by laser drilling includes the step of applying a plurality of laser pulses to the substrate.

59. The laminated substrate according to claim 58, wherein each pulse has a pulse width of ≦100 ns.

60. The laminated substrate according to claim 58, wherein the step of forming each through-via in the substrate by laser drilling includes the step of applying an energy density per pulse to the substrate that is greater than an ablation energy density threshold of the conductive layer.

61. The laminated substrate according to claim 60, wherein the energy density per pulse applied to the substrate for drilling each through-via is greater than about 1.5 $J/cm^2$; and wherein the energy density per pulse applied to the dielectric layer for drilling each blind-via is between 0.5 $J/cm^2$ and 3 $J/cm^2$ inclusive.

62. The laminated substrate according to claim 61, wherein the energy density per pulse applied to the substrate for drilling each through-via is nominally 5 $J/cm^2$.

* * * * *